US007696442B2

(12) United States Patent
Muramatsu et al.

(10) Patent No.: US 7,696,442 B2
(45) Date of Patent: Apr. 13, 2010

(54) WIRING BOARD AND MANUFACTURING METHOD OF WIRING BOARD

(75) Inventors: Masaki Muramatsu, Komaki (JP); Shinji Yuri, Kasugai (JP); Makoto Origuchi, Komaki (JP); Kazuhiro Urashima, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 317 days.

(21) Appl. No.: 11/445,288

(22) Filed: Jun. 2, 2006

(65) Prior Publication Data

US 2006/0272853 A1 Dec. 7, 2006

(30) Foreign Application Priority Data

Jun. 3, 2005 (JP) .......................... P.2005-163673
Oct. 6, 2005 (JP) .......................... P.2005-293806
Mar. 28, 2006 (JP) .......................... P2006-087569

(51) Int. Cl.
*H05K 1/16* (2006.01)
(52) U.S. Cl. ...................................... 174/260; 361/763
(58) Field of Classification Search ................ 174/260, 174/261, 250, 264; 361/763, 764; 29/830
See application file for complete search history.

(56) References Cited

U.S. PATENT DOCUMENTS 6,721,153 B2 * 4/2004 Naito et al. ................. 361/100
6,724,638 B1 * 4/2004 Inagaki et al. ............... 361/763
6,876,554 B1 4/2005 Inagaki et al.
6,952,049 B1 10/2005 Ogawa et al.
6,979,890 B2 12/2005 Kambe et al.
7,002,075 B2 2/2006 Kambe et al.
7,239,014 B2 7/2007 Ogawa et al.
7,513,037 B2 4/2009 McCormack et al.
2002/0175402 A1 11/2002 McCormack et al.
2002/0191368 A1 * 12/2002 Li .......................... 361/306.1
2004/0009335 A1 1/2004 Kojima et al.
2004/0140553 A1 * 7/2004 Naito et al. ................. 257/700
2004/0160751 A1 8/2004 Inagaki et al.
2005/0157478 A1 7/2005 Inagaki et al.
2005/0207091 A1 9/2005 Kambe et al.
2005/0281008 A1 * 12/2005 He et al. ..................... 361/748

(Continued)

FOREIGN PATENT DOCUMENTS

EP 1 041 631 A2 10/2000

(Continued)

*Primary Examiner*—Jinhee J Lee
*Assistant Examiner*—Yuriy Semenenko
(74) *Attorney, Agent, or Firm*—Sughrue Mion, PLLC

(57) ABSTRACT

A wiring board comprising: a core board including a core body and a ceramic sub-core which is accommodated in a sub-core accommodation space that is a through-hole that communicates with major surfaces of the core body or a recess having an opening in a first major surface of the core body; and wiring laminates each formed by resin insulating layers and conductor layers laminated on each of major surfaces of the core board, wherein: a groove-filling portion which fills a gap between the core body and the ceramic sub-core is integral with a lowest resin insulating layer of the first-major-surface-side wiring laminate; and via conductors that are connected to respective conductor patterns formed on a first major surface of the ceramic sub-core penetrate through the lowest resin insulating layer.

8 Claims, 23 Drawing Sheets

U.S. PATENT DOCUMENTS

2006/0137902 A1* 6/2006 Kubota et al. ............... 174/250

FOREIGN PATENT DOCUMENTS

| | | | |
|---|---|---|---|
| EP | 1 139 705 | A1 | 10/2001 |
| JP | 6268098 | A | 9/1994 |
| JP | 2000-349225 | A | 12/2000 |
| JP | 2002-100875 | | 4/2002 |
| JP | 2002-204045 | | 7/2002 |
| JP | 2002-237683 | | 8/2002 |
| JP | 2002-270991 | A | 9/2002 |
| JP | 2002-271025 | A | 9/2002 |
| JP | 2002-271033 | A | 9/2002 |
| JP | 2002-374071 | A | 12/2002 |
| JP | 2004-31812 | | 1/2004 |
| JP | 2004-349672 | | 12/2004 |
| JP | 2005-39217 | | 2/2005 |
| JP | 2005-39243 | | 2/2005 |
| JP | 2005-072627 | A | 3/2005 |
| JP | 2006-049762 | A | 2/2006 |

* cited by examiner

STEP 1

STEP 2

STEP 3

STEP 4

STEP 5

STEP 6

STEP 7

STEP 8

STEP 9

STEP 10

STEP 11

STEP 12

1B
L1
CB
L2
CR
B14
M14
B13
M13
B12
M12
B10
M11
M21
B21
M22
B22
M23
B23
M24
B24
WP1
62
61
MP1
2
54
MP2
61
62
WP2
8a
56
53
52
51
6
4
25
25A
25B
23
21
31
32
33
36
37
39
3
55
7(7s)
7(7a,7b)

STEP 8'

STEP 9'

STEP 10'

STEP 11'

STEP 12'

STEP 13'

STEP 14'

1C
L1
L2
CB
CR
B14
M14
B13
M13
B12
M12
B11
M11
M21
B21
M22
B22
M23
B23
M24
B24
7(7s)
7(7a,7b)
55
8a
56
MP1
MP2
62
61
41
2

1D
L1
B14
M14
B13
M13
B12
M12
B11
M11
CB
CR
L2
M21
B21
M22
B22
M23
B23
M24
B24
7(7s)
7(7a,7b)
55
51
52
53
54
56
6
65
8a
MP1
MP2
62
61
41
2
3
4
21
23
25
30
31
32
33
34
36
37
38

WIRING BOARD AND MANUFACTURING METHOD OF WIRING BOARD

FIELD OF THE INVENTION

The present invention relates to a wiring board having a core board that accommodates a ceramic sub-core mainly made of ceramics.

BACKGROUND OF THE INVENTION

Conventionally, to reduce the switching noise of a semiconductor integrate circuit device (hereinafter referred to as "IC chip") and stabilize its operation power supply voltage, a capacitor is provided in a wiring board that is mounted with the IC chip. As for the manner of mounting the capacitor on the wiring board, as the lengths of interconnections between the IC chip and the capacitor increase, the inductance components of the interconnections increase and it becomes more difficult to attain the above effects sufficiently. It is therefore desirable that the capacitor be disposed as close to the IC chip as possible. JP-A-2005-39243 proposes a wiring board in which a core board located right under an IC chip accommodates a ceramic sub-core that incorporates a capacitor.

SUMMARY OF THE INVENTION

Incidentally, for example, a core board as described above is produced in the following manner. As shown in FIG. 14A, a second major surface MP2 of a core body CM in which a sub-core accommodation space (through-hole) is formed is covered with an adhesive sheet S having an adhesive ad. A ceramic sub-core CS is accommodated in the core body CM by inserting the ceramic sub-core CS through the opening in a first major surface MP1 and fixing it to the adhesive ad. Then, a filling resin JJ containing an inorganic filler such as a silica filler is injected into the gap between the core body CM and the ceramic sub-core CS by means of a known dispenser DS.

However, where as mentioned above the filling resin JJ is injected using the dispenser DS, the following problem arises on the first major surface MP1 side of the ceramic sub-core CS. The shape of the sub-core accommodation space and the size and positional accuracy of the ceramic sub-core CS have certain variations. Therefore, even if the dispenser DS injects a constant amount of filling resin JJ, as shown in FIG. 14B the filling resin JJ injected in the gap between the core body CM and the ceramic sub-core CS is projected or recessed to cause asperities on the surface. In this case, it is difficult to form flat insulating resin layers thereon because they reflect those asperities.

The present invention has been made in view of the above problem, and an object of the present invention is therefore to provide a wiring board which has a core board accommodating a ceramic sub-core and in which flat insulting resin layers are formed on the core board.

To attain the above object, the invention provides a wiring board provided with a core board having a plate-like core body and a ceramic sub-core which is accommodated in a sub-core accommodation space that is a through-hole that communicates with major surfaces of the core body or a recess having an opening in a first major surface of the core body; and wiring laminates each formed by resin insulating layers and conductor layers laminated on each of major surfaces of the core board, characterized in:

that a groove-filling portion which fills a gap between the core body and the ceramic sub-core is integral with a lowest resin insulating layer of the first-major-surface-side wiring laminate; and that via conductors that are connected to respective conductor patterns formed on a first major surface of the ceramic sub-core penetrate through the lowest resin insulating layer.

And, preferably, a surface, located over the gap between the core body and the ceramic sub-core, of the lowest resin insulating layer is smaller than a surface connecting a top end of an inner side surface of the core body and a top end of an outer side surface of the ceramic sub-core in an inclination from the first major surface of the core body.

With the above configuration, since the groove-filling portion which fills the gap between the core body and the ceramic sub-core is integral with the lowest resin insulating layer of the first-major-surface-side wiring laminate, the surface of the lowest resin insulating layer is flat and hence the entire wiring laminate is made flat.

As for the flatness of the lowest resin insulating layer, it is preferable that that surface of the lowest resin insulating layer which is located over the gap between the core body and the ceramic sub-core, where largest asperities would otherwise occur, be higher in parallelism with (i.e., smaller in the inclination from) the first major surface of the core body than the surface connecting the top end of the inner side surface of the core body and the top end of the outer side surface of the ceramic sub-core.

The lowest resin insulating layer may be provided on the gap between the core body and the ceramic sub-core, the ceramic sub-core, and the core body, and an inclination of the surface of the lowest resin insulating layer may be smaller than an inclination of the surface connecting the top end of the inner side surface of the core body and the top end of the outer side surface of the ceramic sub-core, said inclinations being defined with respect to the first major surface of the core body.

That is, from the viewpoint of making the entire lowest resin insulating layer flat, it is preferable that not only that surface of the lowest resin insulating layer which is located over the gap between the core body and the ceramic sub-core but also those surfaces of the lowest resin insulating layer which are located over the ceramic sub-core and the core body be higher in parallelism with the first major surface of the core body than the surface connecting the top end of the inner side surface of the core body and the top end of the outer side surface of the ceramic sub-core.

For example, the lowest resin insulating layer which is integral with the groove-filling portion can be produced by printing a resin paste on the first major surfaces of the ceramic sub-core and the core body using a squeegee or the like in a state that the ceramic sub-core is accommodated in the sub-core accommodation space.

A first specific form of the wiring board according to the invention is such that in the first-major-surface-side wiring laminate, the via conductors which penetrate through the lowest resin insulating layer are parts of respective multilayer penetration via conductors that penetrate through plural layers that are the lowest resin insulating layer and a resin insulating layer adjacent to the lowest resin insulating layer, and connect the conductor patterns formed on the first major surface of the ceramic sub-core to the conductor layer formed on the adjacent resin insulating layer.

This configuration makes it possible to form the lowest resin insulating layer with a material that is smaller than the adjacent resin insulating layer in the linear expansion coefficient. In particular, the lowest resin insulating layer can be made of a material whose linear expansion coefficient lies halfway between the linear expansion coefficients of the adjacent resin insulating layer and the ceramic sub-core, which provides an effect of absorbing a difference in the linear expansion coefficient in the thickness direction. More specifically, the lowest resin insulating layer may be made of a material whose average linear expansion coefficient in a range of room temperature to 200° C. (hereinafter referred to simply as "linear expansion coefficient") is smaller than or equal to 35 ppm/° C. (preferably, smaller than or equal to 33 ppm/° C.). If the linear expansion coefficient of the lowest resin insulating layer exceeds this upper limit, it is on the same level as that of the wiring laminate which is mainly made of a polymeric material and hence the above effect may not be attained satisfactorily. To attain such a linear expansion coefficient, the lowest resin insulating layer may be made of a material that is higher in filler content than the adjacent resin insulating layer. More specifically, the filler content of the lowest resin insulating layer may be set at 50 to 80 wt %.

A second specific form of the wiring board according to the invention is such that in the first-major-surface-side wiring laminate, the via conductors which penetrate through the lowest resin insulating layer connect the conductor patterns formed on the first major surface of the ceramic sub-core to the conductor layer formed on the lowest resin insulating layer. This configuration makes it possible to form good via holes that are free of steps, which in turn enables connections by good via conductors.

Furthermore, the invention provides a wiring board provided with a core board having a plate-like core body and a ceramic sub-core which is accommodated in a sub-core accommodation space that is a through-hole that communicates with major surfaces of the core body or a recess having an opening in a first major surface of the core body; and wiring laminates each formed by resin insulating layers and conductor layers laminated on each of major surfaces of the core board, characterized in:

that a groove-filling portion which fills a gap between the core body and the ceramic sub-core is integral with a lowest resin insulating layer of the first-major-surface-side wiring laminate; and that via conductors that are connected to respective conductor patterns formed on a first major surface of the ceramic sub-core penetrate through the lowest resin insulating layer.

And, preferably, a surface, located over the gap between the core body and the ceramic sub-core and the ceramic sub-core, of the lowest resin insulating layer is substantially parallel with the first major surface of the core body.

With the above configuration, since the groove-filling portion which fills the gap between the core body and the ceramic sub-core is integral with the lowest resin insulating layer of the first-major-surface-side wiring laminate, the surface of the lowest resin insulating layer is substantially parallel with the first major surface of the core body and is flat following the flat first major surface of the core body. The entire wiring laminate is thus made flat.

The invention provides a first manufacturing method of a wiring board provided with a core board in which a sub-core accommodation space that is a through-hole that communicates with major surfaces of a plate-like core body or a recess having an opening in a first major surface of the core body is formed in the core body and a ceramic sub-core is accommodated in the sub-core accommodation space; and wiring laminates each formed by resin insulating layers and conductor layers laminated alternately on each of major surfaces of the core board, characterized by comprising, as steps executed in written order:

a sub-core accommodation step of accommodating the ceramic sub-core in the sub-core accommodation space through the first-major-surface-side opening of the sub-core accommodation space; and a pressure printing step of charging a resin paste into a gap between the core body and the ceramic sub-core by pressure-printing the resin paste from the side of the first major surface of the core body and a first major surface of the ceramic sub-core.

According to the first manufacturing method of a wiring board according to the invention, a charged resin portion for filling the gap between the ceramic sub-core and the core body and fixing them to each other can be formed satisfactorily without formation of voids by pressure-printing (charging) a resin paste into the gap between the ceramic sub-core and the core body.

It is preferable that the viscosity of the resin paste be 3 to 60 Pa·s in a temperature range of room temperature (e.g., 25° C.) to 120° C. (it is even preferable that the viscosity be 5 to 58 Pa·s). To perform pressure printing, it is preferable that the viscosity be higher than the lower limit. On the other hand, if the viscosity is higher than the upper limit, the resin paste may not be charged satisfactorily even by pressure printing because its flowability becomes too low. To obtain such viscosity, it is preferable that the filler content of the resin paste be 50 to 80 wt % (it is even preferable that the filler content be 52 to 78 wt %).

In the first manufacturing method of a wiring board according to the invention, it is preferable that in the pressure printing step, the resin paste be charged into the gap between the core body and the ceramic sub-core by pressure-printing the resin paste at least on the first major surface of the ceramic sub-core directly without intervention of a mask and a layer that is continuous with the resin paste charged in the gap be formed as a continuous-with-charged-resin layer so as to cover at least the first major surface of the ceramic sub-core. This manufacturing method can simplify the process because pressure printing is performed at least on the first major surface of the ceramic sub-core without using a mask. Furthermore, the continuous-with-charged-resin layer can be formed at the same time as the resin paste is charged into the space between the core body and the ceramic sub-core.

In the first manufacturing method of a wiring board according to the invention, in the pressure printing step, the resin paste may be charged into the gap between the core body and the ceramic sub-core by pressure-printing the resin paste on the first major surfaces of the ceramic sub-core and the core body directly without intervention of a mask and a layer that is continuous with the resin paste charged in the gap may be formed as a continuous-with-charged-resin layer so as to entirely cover the first major surfaces of the ceramic sub-core and the core body. This manufacturing method can simplify the process because pressure printing is performed without using a mask. Furthermore, since the continuous-with-charged-resin layer is formed so as to cover the entire first major surface of the core board, this manufacturing method contributes to flattening of a wiring board produced.

The first manufacturing method of a wiring board according to the invention may further comprise, as a step executed before the sub-core accommodation step, a closing step of closing a second-major-surface-side opening of the sub-core accommodation space that is the through-hole that communicates with the major surfaces of the core body with a sheet having an adhesive on one surface in such a manner that the adhesive is exposed inside the sub-core accommodation space; and in the sub-core accommodation step, the ceramic sub-core may be accommodated through the first-major-surface-side opening of the sub-core accommodation space and fixed to the adhesive. The pressure printing step is executed in this state. Where the sub-core accommodation space is a through-hole, this manufacturing method makes it possible to execute the pressure printing step in a state that the ceramic sub-core is fixed by means of the adhesive on the sheet surface.

The first manufacturing method of a wiring board according to the invention may further comprise, as steps executed after the pressure printing step a lowest dielectric layer formation step of forming a lowest resin insulating layer of the first-major-surface-side wiring laminate on the continuous-with-charged-resin layer; a multi-layer penetration via hole formation step of forming multi-layer penetration via holes that penetrate through the lowest resin insulating layer and the continuous-with-charged-resin layer and thereby exposing, inside the multi-layer penetration via holes, conductor pads formed on the first major surface of the ceramic sub-core; and a multi-layer penetration via conductor formation step of forming multi-layer penetration via conductors in the respective multi-layer penetration via holes by charging. Even if the continuous-with-charged-resin layer exists between the ceramic sub-core and the wiring laminate that is formed on the first major surface of the ceramic sub-core, this manufacturing method enables conduction between the conductor pads on the ceramic sub-core and interconnections in the wiring laminate by forming the multi-layer penetration via conductors.

A wiring board according to the invention which is produced by the above manufacturing method is a wiring board provided with a core board in which a sub-core accommodation space that is a through-hole that communicates with major surfaces of a plate-like core body made of a polymeric material or a recess having an opening in one major surface of the core body is formed in the core body and a plate-like ceramic sub-core made of ceramics is accommodated in the sub-core accommodation space; and wiring laminates each formed by dielectric layers made of a polymeric material and conductor layers laminated alternately on each of major surfaces of the core board, characterized in:

that a continuous-with-charged-resin layer that is continuous with a charged resin portion that fills a gap between the core body and the ceramic sub-core is interposed between the ceramic sub-core and the wiring laminate formed on its major surface; and that multi-layer penetration via conductors that penetrate through a lowest dielectric layer of the wiring laminate and the continuous-with-charged-resin layer are connected to conductor pads formed on the major surface of the ceramic sub-core.

According to this manufacturing method of a wiring board according to the invention, since the continuous-with-charged-resin layer which is continuous with the charged resin portion is formed between the ceramic sub-core and the wiring laminate formed on its major surface, the difference between the linear expansion coefficient (in the thickness direction) of the ceramic sub-core and that of the wiring laminate (and an IC chip mounted thereon) can be absorbed by elastic deformation of the continuous-with-charged-resin layer. This prevents such trouble as disconnection of interconnections around the ceramic sub-core. The continuous-with-charged-resin layer may cover the entire major surface of the core board, which not only provides the above effect but also contributes to flattening of the wiring board.

The continuous-with-charged-resin layer may be made of a material that is smaller than the dielectric layers in the linear expansion coefficient. In particular, the linear expansion coefficient of the continuous-with-charged-resin layer may lie halfway between the linear expansion coefficients of the ceramic sub-core and the dielectric layers. This allows the above-described effect of absorbing the difference between the linear expansion coefficients in the thickness direction to be attained satisfactorily. More specifically, the continuous-with-charged-resin layer may be made of a material whose average linear expansion coefficient in a range of room temperature (e.g., 25° C.) to 200° C. (hereinafter referred to simply as "linear expansion coefficient") is smaller than or equal to 35 ppm/° C. (preferably, smaller than or equal to 33 ppm/° C. excluding 0). If the linear expansion coefficient of the continuous-with-charged-resin layer exceeds this upper limit, it is on the same level as that of the wiring laminate which is mainly made of a polymeric material and hence the above effect may not be attained satisfactorily. To attain such a linear expansion coefficient, the continuous-with-charged-resin layer may be made of a material that is higher in filler content than the dielectric layers. More specifically, the filler content of the continuous-with-charged-resin layer may be set at 50 to 80 wt %.

The invention provides a second manufacturing method of a wiring board provided with a core board in which a sub-core accommodation space that is a through-hole that communicates with major surfaces of a plate-like core body or a recess having an opening in a first major surface of the core body is formed in the core body and a plate-like ceramic sub-core mainly made of ceramics is accommodated in the sub-core accommodation space; and wiring laminates each formed by resin insulating layers and conductor layers laminated alternately on each of major surfaces of the core board, characterized by comprising, as steps executed in written order:

a sub-core accommodation step of accommodating the ceramic sub-core in the sub-core accommodation space through the first-major-surface-side opening of the sub-core accommodation space; and a film formation and charging step of forming a lowest resin insulating layer of the first-major-surface-side wiring laminate by sticking a resin material to the core body and the ceramic sub-core from the first major surface side, and forming a groove-filling portion that is continuous with the lowest resin insulating layer by charging the resin material into a gap between the core body and the ceramic sub-core.

A wiring board according to the invention produced by the above manufacturing method is a wiring board provided with a core board in which a sub-core accommodation space that is a through-hole that communicates with major surfaces of a plate-like core body or a recess having an opening in a first major surface of the core body is formed in the core body and a plate-like ceramic sub-core mainly made of ceramics is accommodated in the sub-core accommodation space; and wiring laminates each formed by resin insulating layers and conductor layers laminated alternately on each of major surfaces of the core board, characterized in:

that a groove-filling portion which fills a gap between the core body and the ceramic sub-core is continuous with a lowest resin insulating layer of the first-major-surface-side wiring laminate; and that via conductors for conduction between conductor patterns formed on the first major surface of the core body or the ceramic sub-core under the single-layer, lowest resin insulating layer of the first-major-surface-side wiring laminate and a conductor layer formed on the lowest resin insulating layer are formed in the lowest resin insulating layer.

According to this manufacturing method of a wiring board according to the invention, the lowest resin insulating layer of the first-major-surface-side wiring laminate and the groove-filling portion which fills the gap between the core body and the ceramic sub-core are formed together so as to be continuous and integral with each other. Therefore, the above-described charged resin portion is not necessary. Since two layers having different characteristics are not formed in superimposition on the ceramic sub-core, via holes can be formed satisfactorily. Since the lowest resin insulating layer and the groove-filling portion are formed together, the lowest resin insulating layer formed on the core board is given a uniform thickness distribution. Further, since the step of injecting a filling resin in the conventional process is omitted, the manufacturing process can be simplified. Still further, the lowest resin insulating layer and the groove-filling portion of a wiring board produced are continuous and integral with each other, the adhesion between the core board and the wiring laminate is increased. Since the ceramic sub-core is surrounded by the groove-filling portion, the adhesion between the core body and the ceramic sub-core is increased.

The invention provides a third manufacturing method of a wiring board provided with a core board in which a sub-core accommodation space that is a through-hole that communicates with major surfaces of a plate-like core body is formed in the core body and a plate-like ceramic sub-core mainly made of ceramics is accommodated in the sub-core accommodation space; and wiring laminates each formed by resin insulating layers and conductor layers laminated alternately on each of major surfaces of the core board, characterized by comprising, as steps executed in written order:

a sub-core accommodation step of accommodating the ceramic sub-core in the sub-core accommodation space; and a film formation and charging step of forming lowest resin insulating layers of the wiring laminates of the two respective major surface sides by sticking a resin material sequentially to the core body and the ceramic sub-core from the sides of the two major surfaces, and forming a groove-filling portion that is continuous with the lowest resin insulating layers of the two major surface sides by charging the resin material into a gap between the core body and the ceramic sub-core.

A wiring board according to the invention produced by the above manufacturing method is a wiring board provided with a core board in which a sub-core accommodation space that is a through-hole that communicates with major surfaces of a plate-like core body is formed in the core body and a plate-like ceramic sub-core mainly made of ceramics is accommodated in the sub-core accommodation space; and wiring laminates each formed by resin insulating layers and conductor layers laminated alternately on each of major surfaces of the core board, characterized in:

that a groove-filling portion which fills a gap between the core body and the ceramic sub-core is continuous with lowest resin insulating layers of the respective wiring laminates; and that via conductors for conduction between conductor patterns formed on each major surface of the core body or the ceramic sub-core under the single-layer, lowest resin insulating layer of the wiring laminate of each of the two major surface sides and a conductor layer formed on the lowest resin insulating layer are formed in the lowest resin insulating layer.

According to this manufacturing method of a wiring board according to the invention, the lowest resin insulating layer of the wiring laminate of each of the two major surface sides and the groove-filling portion which fills the gap between the core body and the ceramic sub-core are formed so as to be continuous and integral with each other. Therefore, the above-described charged resin portion is not necessary. Since two layers having different characteristics are not formed in superimposition on the ceramic sub-core, via holes can be formed satisfactorily. Since the groove-filling portion is formed together with at least one lowest resin insulating layer, the lowest resin insulating layer(s) formed on the core board is given a uniform thickness distribution. Further, since the step of injecting a filling resin in the conventional process is omitted, the manufacturing process can be simplified. Still further, the lowest resin insulating layer of each major surface side and the groove-filling portion of a wiring board produced are continuous and integral with each other, the adhesion between the core board and the wiring laminates is increased. Since the ceramic sub-core is surrounded by the groove-filling portion, the adhesion between the core body and the ceramic sub-core is increased.

The second or third manufacturing method of a wiring board according to the invention may further comprise, as a step executed after the film formation and charging step, the step of forming via conductors for conduction between conductor patterns formed on the/each major surface of the core body or the ceramic sub-core under the single-layer, lowest resin insulating layer of the/each wiring laminate and a conductor layer formed on the lowest resin insulating layer are formed in the lowest resin insulating layer.

In the second or third manufacturing method of a wiring board according to the invention, the film formation and charging step may comprise the steps of:

forming a first lowest resin insulating layer as the lowest resin insulating layer of the first-major-surface-side wiring laminate and forming a first groove-filling portion that is continuous with the first lowest resin insulating layer in such a manner that at least a first-major-surface-side portion of the gap between the core body and the ceramic sub-core is filled with the first groove-filling portion by compression-bonding a resin film to the core body and the ceramic sub-core from the first major surface side in a state that ceramic sub-core is supported from a second major surface side in the sub-core accommodation space that is the through-hole that communicates with the major surfaces of the core body; and forming a second lowest resin insulating layer as the lowest resin insulating layer of the second-major-surface-side wiring laminate and forming a second groove-filling portion that is continuous with the second lowest resin insulating layer in such a manner that a residual portion, not filled with the first groove-filling portion, of the gap between the core body and the ceramic sub-core is filled with the second groove-filling portion by compression-bonding a resin film to the core body and the ceramic sub-core from the second major surface side in a state that ceramic sub-core is supported from the first major surface side by the first lowest resin insulating layer and the first groove-filling portion.

According to this manufacturing method of the invention, the first lowest resin insulating layer and the first groove-filling portion are formed together so as to be continuous and integral with each other by compression-bonding a resin film from the first major surface side. Then, the second lowest resin insulating layer and the second groove-filling portion are formed together so as to be continuous and integral with each other by compression-bonding a resin film from the second major surface side. The first groove-filling portion and the second groove-filling portion are combined together into the above-mentioned groove-filling portion. Compression-bonding a resin film in the above-described manner makes it possible to form the first or second lowest resin insulating layer having a uniform thickness distribution together with the first or second groove-filling portion in such a manner that they are continuous and integral with each other. Furthermore, combining the first groove-filling portion and the second groove-filling portion together into the groove-filling portion can increase the adhesion of the ceramic sub-core on both of the first and second major surface sides.

In the second or third manufacturing method of a wiring board according to the invention, in the film formation and charging step, the second lowest resin insulating layer and the second groove-filling portion may be formed by compression-bonding the resin film from the second major surface side in a state that the first lowest resin insulating film and the first groove-filling portion are not fully cured (are half set).

According to this manufacturing method of the invention, since the second lowest resin insulating layer and the second groove-filling portion may be formed by compression-bonding the resin film from the second major surface side in a state that the first lowest resin insulating film and the first groove-filling portion are not fully cured (are half set), the first groove-filling portion and the second groove-filling portion are rendered continuous and integral with each other and thus become the groove-filling portion. Therefore, the adhesion between the core board and the wiring laminates is increased further.

In the second or third manufacturing method of a wiring board according to the invention, the manufacturing method may further comprise, as a step executed before the sub-core accommodation step, the step of closing a second-major-surface-side opening of the sub-core accommodation space that is the through-hole that communicates with the major surfaces of the core body with a sheet having an adhesive on one surface in such a manner that the adhesive is exposed inside the sub-core accommodation space; and in the sub-core accommodation step, the ceramic sub-core may be supported from the second major surface side by accommodating the ceramic sub-core through the first-major-surface-side opening of the sub-core accommodation space and fixing the ceramic sub-core to the adhesive.

According to this manufacturing method of the invention, since the ceramic sub-core is accommodated in the sub-core accommodation space by fixing the former to the sheet bearing the adhesive, the ceramic sub-core can be positioned easily and accurately before formation of the lowest resin insulating layer and the (first) groove-filling portion.

The second or third manufacturing method of a wiring board according to the invention may further comprise, as steps executed before the sub-core accommodation step, the step of performing surface chemical treatment for increasing adhesion to a resin material only on first-major-surface-side conductor patterns among conductor patterns formed on the two major surfaces of the core body, and the step of covering second-major-surface-side conductor patterns that have not been subjected to the surface chemical treatment with an adhesive by closing a second-major-surface-side opening of the sub-core accommodation space by a sheet, and the manufacturing method may be such that:

in the sub-core accommodation step, the ceramic sub-core in which surface chemical treatment has been performed only on first-major-surface-side conductor patterns among conductor patterns formed on the two major surfaces of the ceramic sub-core is accommodated in the sub-core accommodation space; and in the film formation and charging step, the step of forming the first lowest resin insulating layer and the first groove-filling portion by compression-bonding the resin film to the core body and the ceramic sub-core from the first major surface side, the step of peeling the sheet off the second major surfaces of the core body and the ceramic sub-core and performing surface chemical treatment simultaneously on the second-major-surface-side conductor patterns formed on the core body and second-major-surface-side conductor patterns formed on the ceramic sub-core, and the step of forming the second lowest resin insulating layer and the second groove-filling portion by compression-bonding the resin film on the core body and the ceramic sub-core from the second major surface side are executed in the above order.

Where a sealing member is stuck to the core body or the ceramic sub-core by bringing an adhesive into contact with conductor patterns on the core body or the ceramic sub-core that have been subjected to surface chemical treatment for increasing adhesion to a resin material (e.g., roughening treatment), the sticking of the sealing member may cause an event that the conductor patterns lose the effect of the surface chemical treatment after the sealing member is peeled off (e.g., the asperities of the roughened surfaces are smoothed out by the adhesive). Such an event can be avoided by performing the surface chemical treatment on the conductor patterns on the core body and the ceramic sub-core in the order of the above manufacturing method according to the invention.

DESCRIPTION OF SYMBOLS

Figure 1:
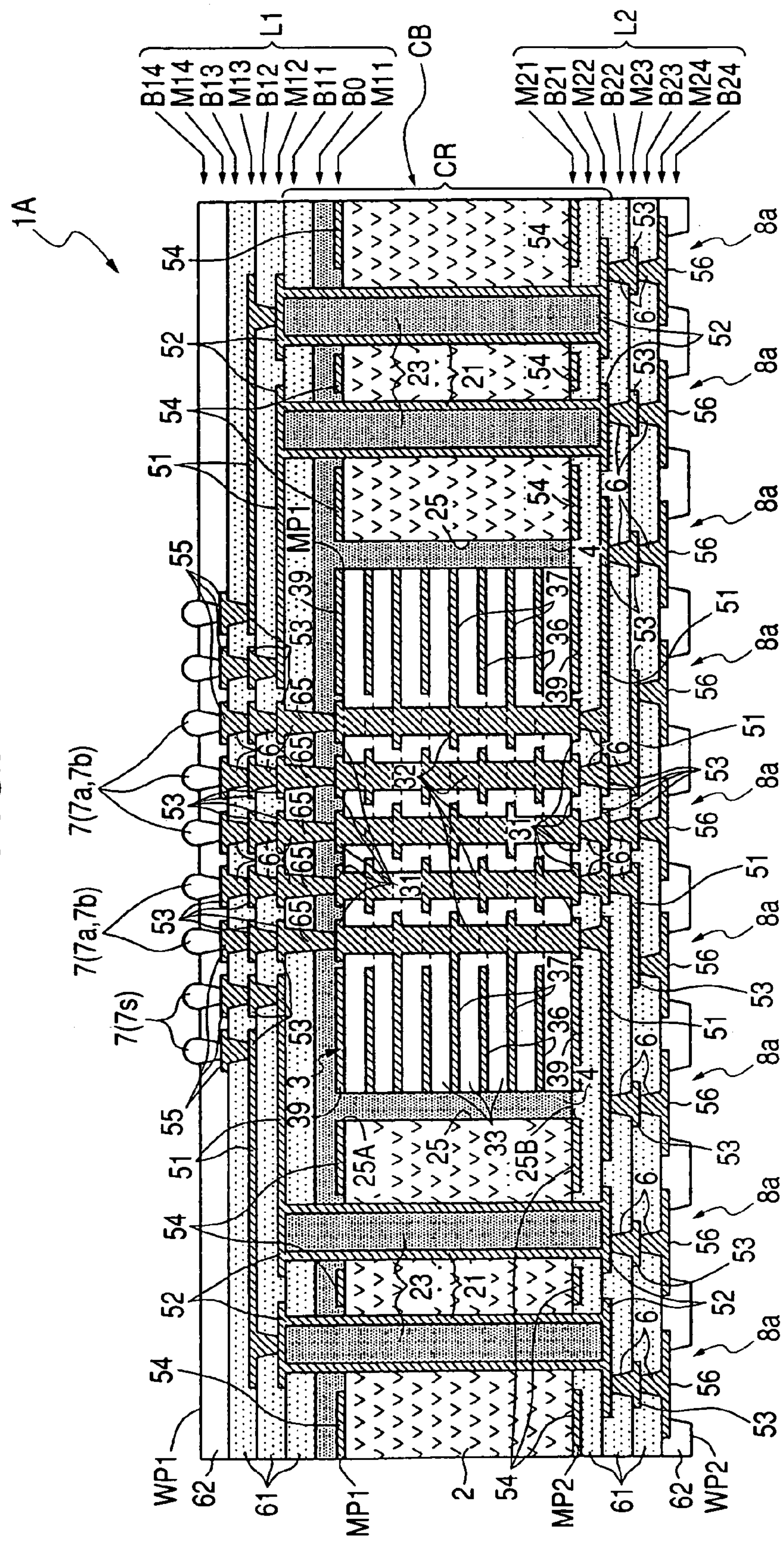
FIG. 1 is a schematic sectional view showing the configuration of a wiring board according to a first embodiment of the present invention.

1A, 1B, 1C, 1D: Wiring board
2: Core body
25: Sub-core accommodation space (through-hole)
25A: First-major-surface-side opening
25B: Second-major-surface-side opening
3: Ceramic subcore (laminated ceramic capacitor)
31: Conductor pad
32: Penetration conductor
33: Ceramic layer
36, 37: Electrode conductor layer
4: Groove-filling portion
6, 65: Via conductor
7: Solder bump (power terminal 7*a*, ground terminal 7*b*, signal terminal 7*s*)
CB: Core board
CR: Core portion
L (L1, L2): Wiring laminate
B: Resin insulating layer
B0, B10: Lowest resin insulating layer of first-major-surface-side wiring laminate
B11: Resin insulating layer adjacent to lowest resin insulating layer (adjacent resin insulating layer)
M: Conductor layer
M11: Conductor patterns formed on first major surfaces of core body and ceramic sub-core
M12: Conductor layer formed on lowest resin insulating layer (or adjacent resin insulating layer)
C: Semiconductor integrated circuit device (IC chip)
GB: Main board (e.g., mother board)
S: Adhesive sheet
101: Plane connecting top end of inner side surface of core body and top end of outer side surface of ceramic sub-core
102: Layer surface located over gap between core body and ceramic sub-core
103: Layer surface located over ceramic sub-core
104: Layer surface located over core body

DETAILED DESCRIPTION OF THE INVENTION

First Embodiment

A wiring board according to a first embodiment of the present invention will be described below with reference to the drawings. FIG. 1 is a schematic sectional view showing the configuration of a wiring board 1A according to the first embodiment. In the following description, as for a plate-like member, a surface shown above in a figure will be called a first major surface WP1, MP1 and a surface shown below will be called a second major surface WP2, MP2. The wiring board 1A has a ceramic sub-core (laminated ceramic capacitor) 3 under solder bumps 7 in a core board CB. The use of the ceramic sub-core 3 shorten the lengths of interconnections between a semiconductor integrated circuit device (IC chip) C and the ceramic sub-core 3 contributes to reduction of the inductance components of the interconnections, which is important in reducing the switching noise of the IC chip C and stabilizing its operation power supply voltage. Since the ceramic sub-core 3 which is made of ceramics and hence has a smaller linear expansion coefficient than that of a core body 2 which is made of an insulative material is located under the solder bumps 7 in the core board CB, the difference of the linear expansion coefficient of the wiring board 1A from that of the IC chip C is reduced and hence the wiring board 1A is not prone to line disconnections or the like due to thermal stress. A detailed description will follow.

Figure 2:
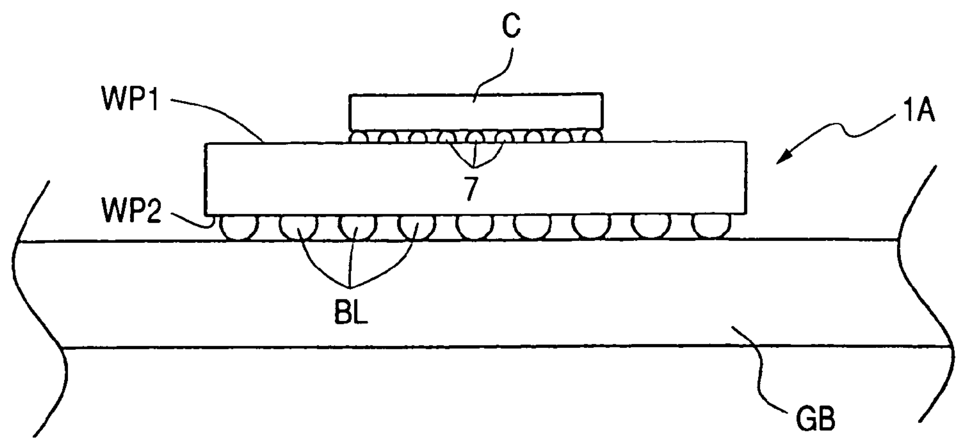
FIG. 2 shows the wiring board that is disposed between a semiconductor integrated circuit device (IC chip) and a main board (e.g., mother board).

FIG. 2 shows the wiring board 1A that is disposed between an IC chip C and a main board (e.g., mother board) GB. The IC chip C has signal terminals, power terminals, and ground terminals on a second major surface and is flip-chip-connected to the solder bumps 7 (Pb—Sn, Sn—Ag, Sn—Sb, or Sn—Zn solder) that are formed on a first major surface WP1 of the wiring board 1A. To elongate the thermal fatigue life of the solder bumps 7, the space between the IC chip C and the first major surface WP1 of the wiring board 1A is filled with an under fill material that is a thermosetting resin. On the other hand, the main board (e.g., mother board) GB is mainly made of a resin material that is reinforced by a filler that is ceramic particles or fiber, and is connected to terminal pads 56 (see FIG. 1) via solder balls BL formed on a second major surface WP2 of the wiring board 1A.

Figure 3:
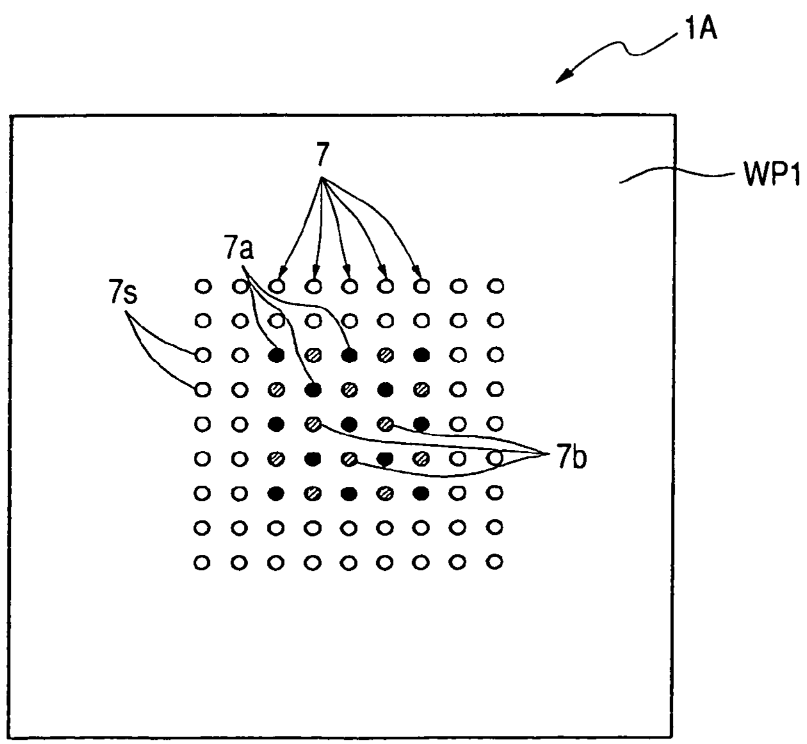
FIG. 3 shows a first major surface of the wiring board.
Figure 4:
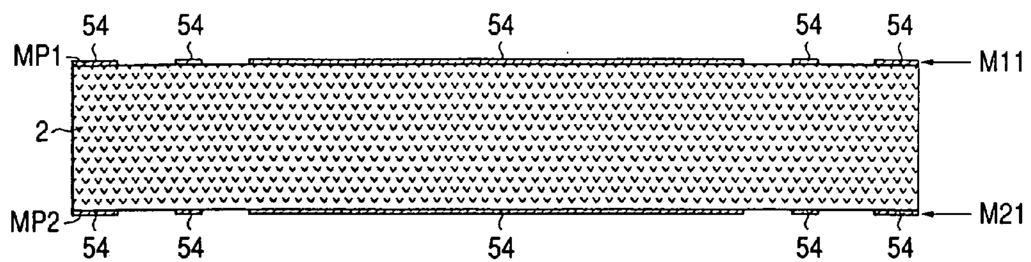
FIG. 4 shows manufacturing steps of a wiring board.
Figure 4:
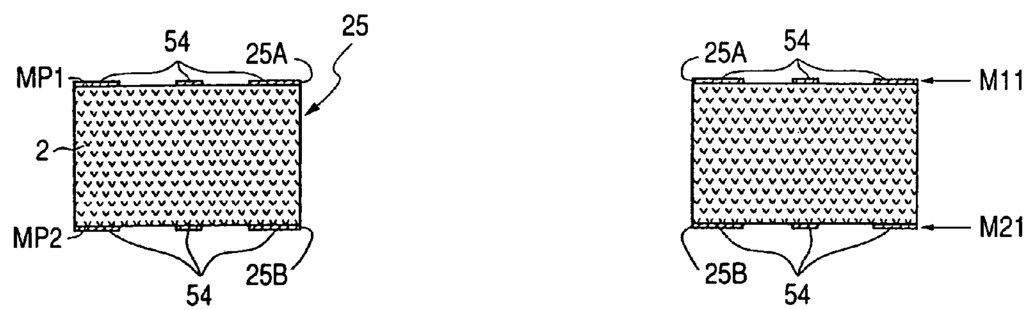
Figure 4:
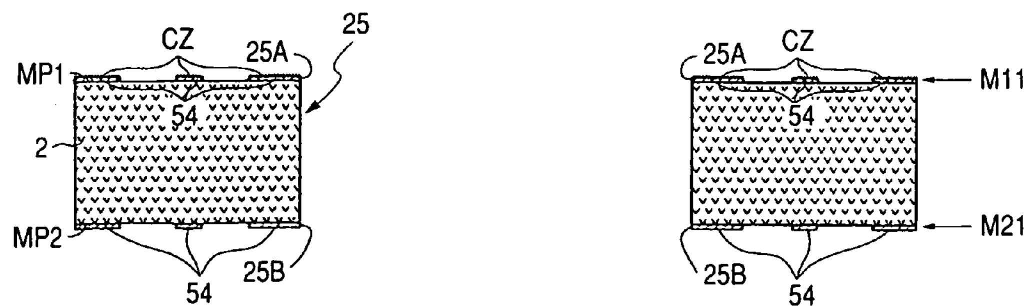

FIG. 3 shows the first major surface WP1 of the wiring board 1A. The solder bumps 7 are arranged in lattice form (or in a staggered manner). Among the solder bumps 7, power terminals 7*a* and ground terminals 7*b* are arranged in checkered form in a central region and signal terminals 7*s* are arranged around them. The solder bumps 7 correspond to the respective terminals of the IC chip C.

A core body 2 is a plate-like member of a heat resistant resin plate (e.g., bismaleimide triazine resin plate) or a fiber-reinforced resin plate (e.g., glass-fiber-reinforced epoxy resin plate). Wiring patterns (inner layer patterns) may be formed inside the core body 2, in which case the wiring board 1A can even be enhanced in functionality. Furthermore, the core body 2 may be formed by laminating thin insulating layers on a core. A sub-core accommodation space (through-hole) 25 is formed in a region including the region under the solder bumps 7 so as to communicate with major surfaces MP1 and MP2. A plate-like ceramic sub-core 3 is accommodated in the sub-core accommodation space 25. The core board CB is thus formed.

The ceramic sub-core 3 is a laminated ceramic capacitor in which plural ceramic layers 33 and plural electrode conductor layers 36 or 37 are laminated alternately. One of the set of electrode conductor layers 36 and the set of electrode conductor layers 37 is power-side electrode conductor layers corresponding to the power terminals 7*a* and the other is ground-side electrode conductor layers corresponding to the ground terminals 7*b*. As such, the electrode conductor layers 36 and the electrode conductor layers 37 are arranged alternately in the lamination direction so as to be separated from each other by the ceramic layers 33 and hence isolated from each other in a DC sense. Metallization pads 31 connected to the power-side electrode conductor layers or the ground-side electrode conductor layers and a dam metallization layer 39 surrounding the metallization pads 31 are formed in each of the major surfaces MP1 and MP2 of the ceramic sub-core 3.

Figure 9A:
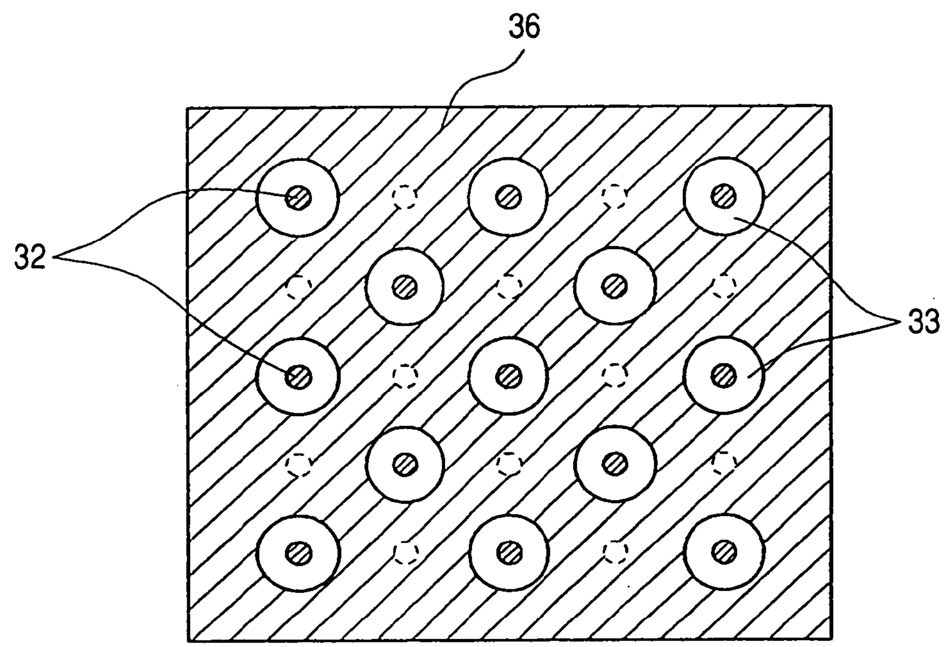
FIG. 9 (FIGS. 9A and 9B) is horizontal sectional views of a ceramic sub-core (laminated ceramic capacitor).
Figure 9B:
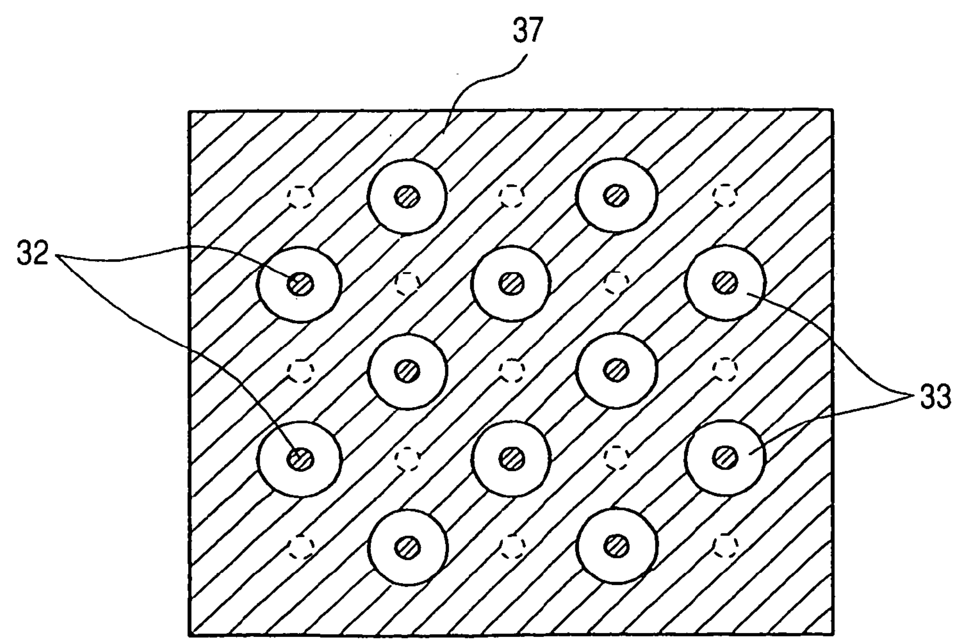

More specifically, as shown in a horizontal sectional view of FIG. 9A, in a layer in which the electrode conductor layer 36 extends in a horizontal plane, the electrode conductor layer 36 is isolated from penetration conductors 32 that are connected to the electrode conductor layers 37 located immediately over and under the electrode conductor layer 36 with ceramic layers 33 interposed in between and the gaps are filled with connecting portions of the ceramic layers 33. On the other hand, as shown in FIG. 9B, in a layer in which an electrode conductor layer 37 extends in a horizontal plane, the electrode conductor layer 37 is isolated from penetration conductors 32 that are connected to the electrode conductor layers 36 located immediately over and under the electrode conductor layer 37 with ceramic layers 33 interposed in between and the gaps are filled with connecting portions of the ceramic layers 33. Having the above structure, the ceramic sub-core 3 functions as a laminated ceramic capacitor.

Figure 10:
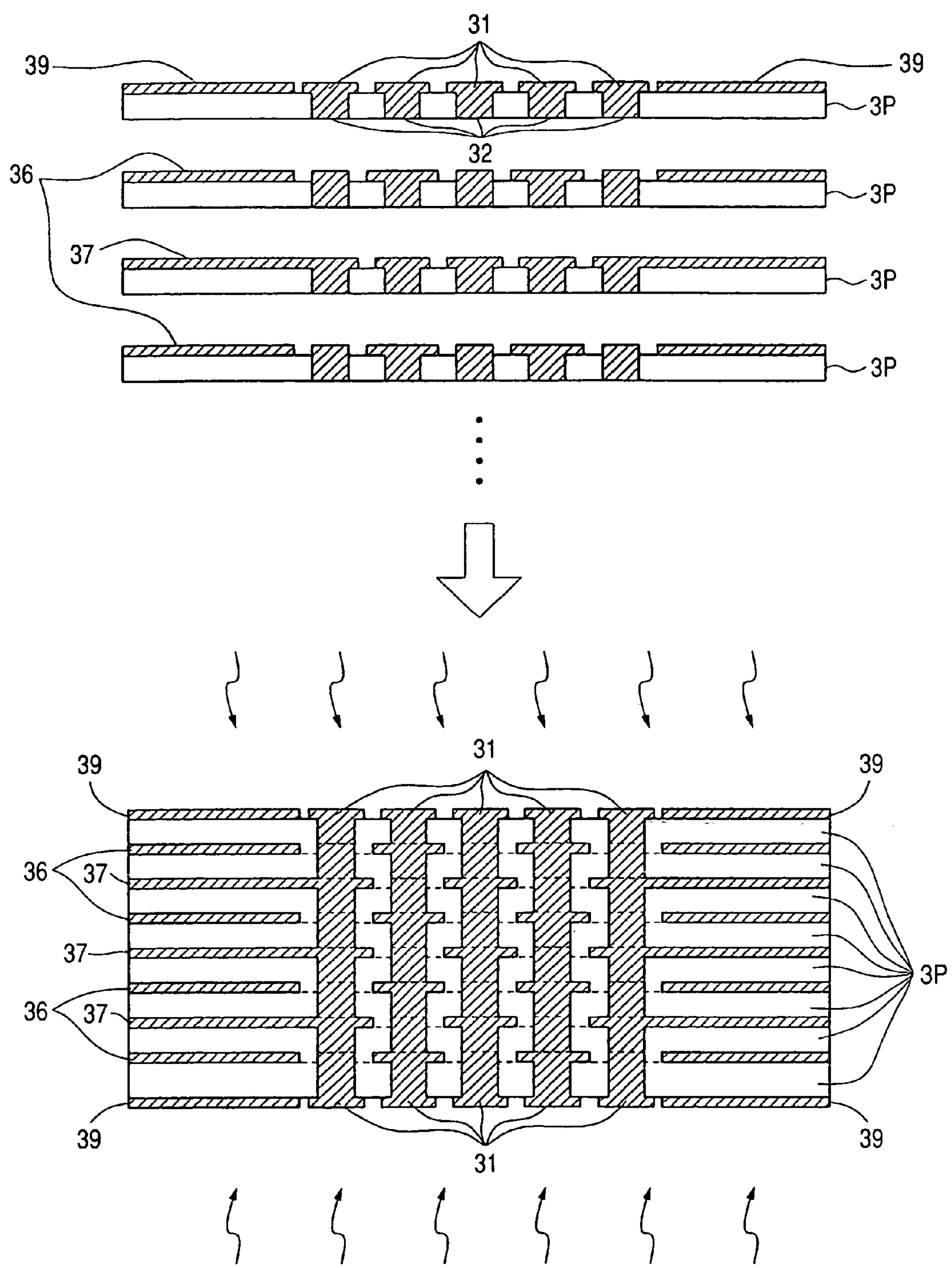
FIG. 10 shows a manufacturing process of the ceramic sub-core (laminated ceramic capacitor).

The above laminated ceramic capacitor can be produced by firing a ceramic material and a metal material simultaneously as described below. As shown in FIG. 10, through-holes are formed in a ceramic green sheet containing a ceramic material powder (to become a ceramic layer 33) by punching, laser hole formation, or the like. The through-holes are filled (to form portions of penetration conductors 32) and patterns to become an electrode conductor layer 36 or 37 or metallization pads 31 and a dam metallization layer 39 are formed on one major surface of the ceramic green sheet by applying a metal paste containing a metal material powder by printing. Ceramic plate units 3P thus obtained are laminated together and a resulting laminated body is fired, whereby a laminated ceramic capacitor is obtained. The electrode conductor layers 36 or 37, which are finally connected to each other in the lamination direction by the penetration conductors 32, are formed separately in forming their patterns by applying the metal paste by printing.

Examples of the ceramic material of the ceramic layers 33 are alumina, silicon nitride, aluminum nitride, and glass ceramics produced by adding an inorganic filler such as borosilicate glass or borosilicate lead glass by 40 to 60 parts by weight. Examples of the metal material of the metallization pads 31, the penetration conductors 32, the electrode conductor layers 36 and 37, and the dam metallization layers 39 are Ni or Ag-based metals. The surfaces of the metallization pads 31 and the dam metallization layers 39 are plated with Cu.

The ceramic sub-core 3 is a square flat plate measuring 12.0 mm×12.0 mm×0.8 mm (thickness). It is preferable that the thickness of the ceramic sub-core 3 be 0.2 mm to 1.0 mm. If the thickness were smaller than 0.2 mm, the ceramic sub-core 3 could not reliably support the IC chip C when it is mounted on the top solder bumps 7. On the other hand, if the thickness were greater than 1.0 mm, the wiring board 1A would be too thick. The ceramic sub-core 3 is chamfered along the four vertical edges.

Returning to FIG. 1, the gap between the ceramic sub-core 3 and the core body 2, which is part of the sub-core accommodation space 25, is filled with a groove-filling portion 4 made of a resin material. The groove-filling portion 4 is continuous and integral with a lowest resin insulating layer B0 of a wiring laminate L1 which is formed on the side of the first major surface MP1. As such, the groove-filling portion 4 serves to fix the ceramic sub-core 3 to the core body 2 and to absorb the differences between the linear expansion coefficients in the horizontal directions and the thickness direction of the ceramic sub-core 3 and those of the core body 2 by its own elastic deformation. Being continuous and integral with the lowest resin insulating layer B0, the groove-filling portion 4 is high in the adhesion to the core board CB and the wiring laminate L1.

The wiring laminate L1 which is provided on the major surface MP1 of the core board CB has a lamination structure consisting of resin insulating layers B0 and B11-B14 and conductor layers M11-M14. A wiring laminate L2 which is provided on the major surface MP2 of the core board CB has a lamination structure consisting of resin insulating layers B21-B24 and conductor layers M21-M24.

The lowest resin insulating layer B0 which is continuous and integral with the groove-filling portion 4 is formed on the first major surface MP1 of the core board CB. The lowest resin insulating layer B0 is made of the same resin material as the groove-filling portion 4. Covering the core board CB with the lowest resin insulating layer B0 makes it possible to absorb the difference between the linear expansion coefficient (in the thickness direction) of the ceramic sub-core 3 and that of the IC chip C mounted on the wiring laminate L1 by elastic deformation of the lowest resin insulating layer B0. This prevents such trouble as a disconnection of interconnections around the ceramic sub-core 3. The groove-filling portion 4 and the lowest resin insulating layer B0 may be made of a resin produced by adding acid anhydride to an epoxy resin or such a resin as amine.

The resin insulating layers B11-B14 and B21-B24 are basically made of a resin material such as an epoxy resin and contain an appropriate amount of inorganic filler such as a silica powder for adjustment of the dielectric constant or the dielectric breakdown voltage. Among the resin insulating layers B11-B14 and B21-B24, the resin insulating layers B11-B13 and B21-B23 are called build-up layers or via layers and serve for insulation between the conductor layers M11-M13 or M21-M23. Via conductors 6 and multi-layer penetration via conductors 65 for inter-layer connection are formed through the resin insulating layers B11-B14 and B21-B24. On the other hand, the resin insulating layers B14 and B24 are solder resist layers and are formed with holes for exposing the pads 55 or 56.

Although the groove-filling portion 4 and the lowest resin insulating layer B0 are basically made of the same epoxy resin as the resin insulating layers B11-B14 and B21-B24, their linear expansion coefficients are adjusted by changing the contents of the inorganic filler. That is, the groove-filling portion 4 and the lowest resin insulating layer B0 are higher in filler content and hence have a smaller linear expansion coefficient than the resin insulating layers B11-B14 and B21-B24.

The linear expansion coefficient of the lowest resin insulating layer B0 lies halfway between the linear expansion coefficients of the ceramic sub-core 3 and the resin insulating layers B11-B14 and B21-B24. More specifically, whereas the linear expansion coefficients of the ceramic sub-core 3 and the resin insulating layers B11-B14 and B21-B24 are 3 to 13 ppm/° C. and 40 to 50 ppm/° C., respectively, the linear expansion coefficient of the lowest resin insulating layer B0 is smaller than or equal to 32 ppm/° C. (excluding 0). (In particular, it is preferable that the linear expansion coefficient of the lowest resin insulating layer B0 be smaller than or equal to 25 ppm/° C. in the case where it is intended to match the lowest resin insulating layer B0 with the ceramic sub-core 3 in the linear expansion coefficient.) To obtain such a linear expansion coefficient, the filler content of the lowest resin insulating layer B0 may be set at 53 to 80 wt %. (In particular, it is preferable that the filler content of the lowest resin insulating layer B0 be higher than or equal to 70 wt % in the case where it is intended to match the lowest resin insulating layer B0 with the ceramic sub-core 3 in the linear expansion coefficient.)

Figure 13A:
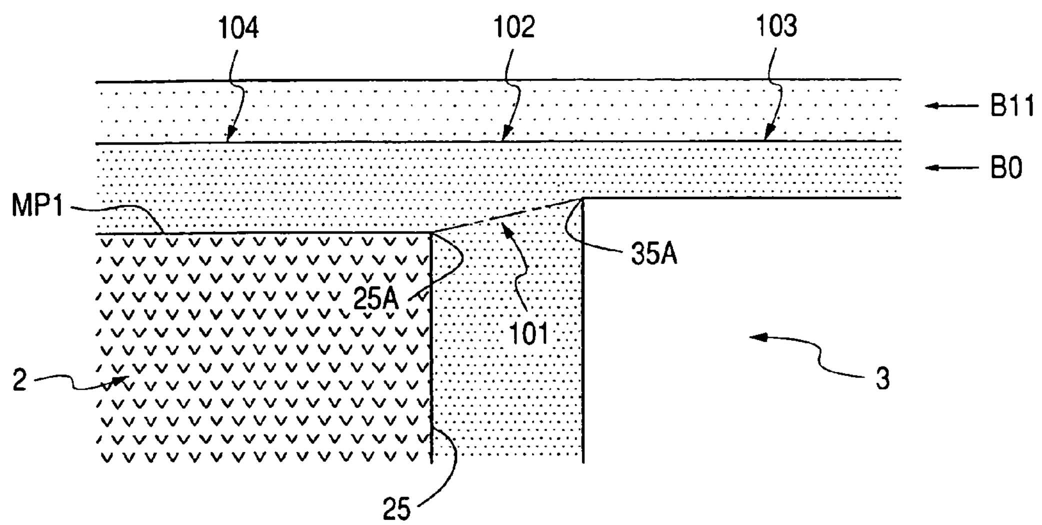
FIG. 13 (FIGS. 13A and 13B) is enlarged views of an important part of the wiring board according to the invention.
Figure 13B:
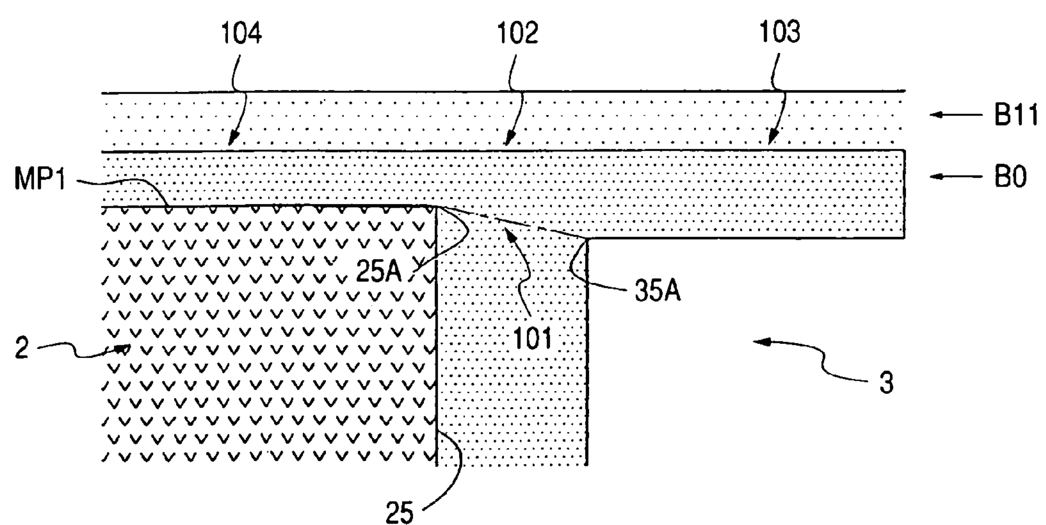
Figure 14A:
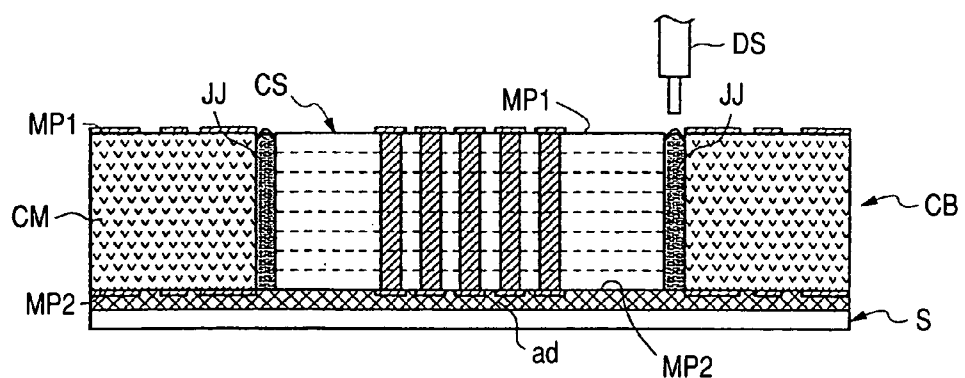
FIG. 14 (FIGS. 14A and 14B) shows a manufacturing process of a conventional wiring board.
Figure 14B:
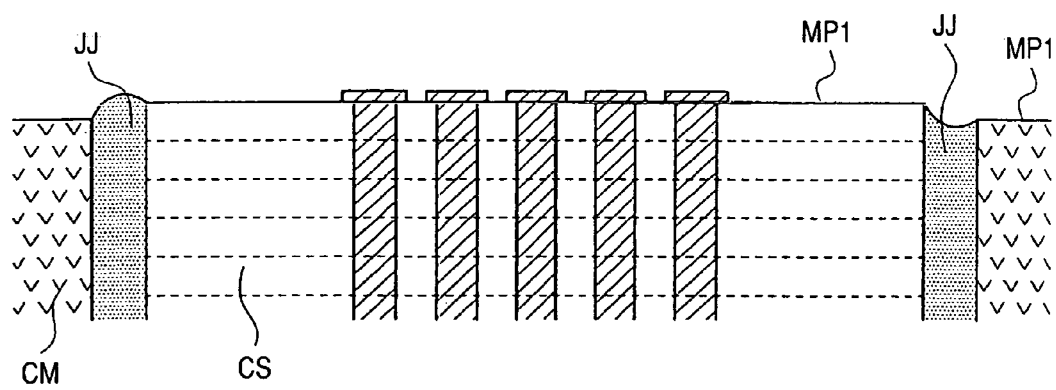

It is rare the core body 2 and the ceramic sub-core 3 are completely the same in height. Usually, either is high as shown in FIGS. 13A and 13B and hence a plane 101 connecting the top end 25A of the inner side surface of the core body 2 (i.e., the opening on the side of the first major surface MP1) and the top end 35A of the outer side surface of the ceramic sub-core 3 is inclined from the first major surface MP1 of the core body 2. On the other hand, since the lowest resin insulating layer B0 is formed by printing with a resin paste (described later in detail), the lowest resin insulating layer B0 is flattened so that the inclination, from the first major surface MP1 of the core body 2, of its surface 102 located over the gap between the core body 2 and the ceramic sub-core 3 is made close to zero. Since the lowest resin insulating layer B0 is so flattened, the overlying resin insulating layers B11-B13 can also be flattened. Likewise, those surfaces 103 and 104 of the lowest resin insulating layer B0 which are located over the ceramic sub-core 3 and the core body 2, respectively, are also made substantially parallel with the first major surface MP1 of the core body 2 (i.e., the inclinations of the surfaces 103 and 104 are made close to zero).

The inclinations can be defined with respect to the first major surface MP1 of the core body 2. That is, the inclinations of the surface 102 located over the gap between the core body 2 and the ceramic sub-core 3, the surface 103 located over the ceramic sub-core 3, and the surface 104 located over the core body 2 are defined as angles formed by straight lines as the surfaces 102-104 appearing in a cross section taken parallel with the thickness direction of the wiring board 1A and a straight line as the first major surface MP1 of the core body 2 appearing in the same cross section. Likewise, the inclination of the plane 101 connecting the top end 25A of the inner side surface of the core body 2 and the top end 35A of the outer side surface of the ceramic sub-core 3 is defined as an angle formed by a straight line as the plane 101 appearing in a cross section taken parallel with the thickness direction of the wiring board 1A and a straight line as the first major surface MP1 of the core body 2 appearing in the same cross section.

A plane is defined by a passing point and a normal vector (i.e., a vector perpendicular to the plane). Therefore, by determining prescribed reference positions, the inclinations (from the first major surface MP1 of the core body 2) of the planes of the surface 102 located over the gap between the core body 2 and the ceramic sub-core 3, the surface 103 located over the ceramic sub-core 3, the surface 104 located over the core body 2, and the plane 101 connecting the top end 25A of the inner side surface of the core body 2 and the top end 35A of the outer side surface of the ceramic sub-core 3 are defined as angles formed by the normal vectors of the surfaces 102-104 and the plane 101 and the normal vector of the first major surface MP1 of the core body 2, respectively.

The conductor layers M11-M14 and M21-M24 consist of Cu-plating-formed interconnections 51 and 53, pads 55 and 56, etc. The via conductors 6 and 65 serve for inter-layer connections between the conductor layers M11-M14 and M21-M24, whereby conduction paths (for signal transmission, power supply, and grounding) from the pads 55 to the pads 56 are formed. The pads 55 and 56 are provided for formation of the solder bumps 7 or the solder balls BL, and their surfaces are Ni—Au-plated.

In particular, the via conductors 65 are multi-layer penetration via conductors that penetrate through the two layers, that is, the lowest resin insulating layer B0 and the adjacent resin insulating layer B11. As such, the via conductors 65 connect the conductor pads 31 (conductor layer M11) formed on the first major surface MP1 of the ceramic sub-core 3 to the conductor layer M12 formed on the adjacent resin insulating layer B11.

Through-holes are formed through the core body 2 of the bore board CB and the resin insulating layers B0, B11, and B21, and through-hole conductors 21 for conduction between the wiring laminates L1 and L2 are formed on the inner surfaces of the through-holes. The through-hole conductors 21 correspond to the respective signal terminals 7*s*. The inside spaces of the through-hole conductors 21 are filled with a resin hole-filling material 23 that is an epoxy resin containing an inorganic filler such as a silica filler, and Cu-plating-formed lid conductors 52 are provided at both ends of each through-hole conductor 21. That portion of the wiring board 1A which extends from the conductor layer M12 to the conductor layer M22 and has the core substrate CB as a main part is called "core portion CR."

Next, a manufacturing method of a wiring board according to the embodiment of the invention will be described with reference to the drawings. FIGS. 4-8 show a manufacturing method of the wiring board 1A.

At step 1, conductor patterns 54 (conductor layers M11 and M12) are formed on the two major surfaces MP1 and MP2 of a core body 2. For this purpose, a copper-clad laminate is used in which 35-μm-thick copper foil is stuck to both major surfaces of a heat resistant resin plate (e.g., bismaleimide triazine resin plate) or a fiber-reinforced resin plate (e.g., glass-fiber-reinforced epoxy resin plate) measuring 400 mm×400 mm×0.8 mm (thickness). The copper foil is etched into the conductor patterns 54 by using masks.

At step 2, a through-hole as a sub-core accommodation space 25 that communicates with the major surfaces MP1 and MP2 is formed by a router. The through-hole as the sub-core accommodation space 25 is a hole having an substantially square cross section each side of which measures 14.0 mm. The walls of the sub-core accommodation space (through-hole) 25 is formed with fillets along the four wall-connecting lines. The adhesion to a later-charged groove-filling portion 4 can be increased by subjecting the side surfaces of the sub-core accommodation space 25 to roughening treatment using potassium permanganate or the like. Furthermore, an organic compound (coupling agent) may be applied to the side surfaces.

At step 3 (roughening step), surface chemical treatment for increasing the adhesion to a resin material is performed only on the conductor patterns 54 formed on the first major surface MP1 among the conductor patterns 54 formed on the two major surfaces MP1 and MP2 of the core body 2. An example of this surface chemical treatment is Cu roughening treatment to be used for roughening a copper surface (e.g., known micro-etching treatment or blackening treatment). Roughening the copper surfaces increases the adhesion to the lowest resin insulating layer B0 of the wiring laminate L1 by the anchor effect. To attain this effect sufficiently, it is preferable that the Cu roughening treatment be performed so that the JIS-B-0601 10-point average roughness (Rz) becomes about 0.3 to 20 μm. Cleaning treatment is performed after the Cu roughening treatment. If necessary, coupling treatment may be performed by using a silane coupling agent.

Another example of the surface chemical treatment is treatment of forming a very thin adhesion layer of an alloy including Cu and Sn on the copper surfaces. This treatment can attain sufficient adhesion to the lowest resin insulating layer B0 of the wiring laminate L1 without the need for roughening the copper surfaces. More specifically, the adhesion layer includes an alloy of Cu, Sn, and a third metal (at least one metal selected from Ag, Zn, Al, Ti, Bi, Cr, Fe, Co, Ni, Pd, Au, and Pt). For example, the adhesion layer includes Cu at about 1 to 50 at %, Sn at about 20 to 98 at. %, and the third metal at about 1 to 50 at. %. To attain a sufficient adhesion effect, it is preferable that the thickness of the adhesion layer be 0.001 to 1 μm.

At step 4 (closing step), a second-major-surface-MP2-side opening 25B of the sub-core accommodation space 25 is closed by an adhesive sheet S having an adhesive ad on one surface in such a manner that the adhesive ad is exposed to the inside of the sub-core accommodation space 25. It is preferable that the adhesive ad of the adhesive sheet S have adhesive strength that is higher than or equal to 8.0 N/25 mm (measured by the 180° peeling method (JIS Z 0237)). The unit "N/25 mm" means force obtained by a measurement on a 25-mm-wide adhesive sheet sample. The adhesive sheet S (base) may be a resin sheet of polyester, polyimide, PET, or the like. For example, the adhesive ad that is provided on one surface of the adhesive sheet S may be a silicone adhesive, an acrylic adhesive, a thermoplastic rubber adhesive, or the like.

At step 5 (sub-core accommodation step), a ceramic sub-core 3 is inserted into the sub-core accommodation space 25 through its first-major-surface-MP1-side opening 25A and is fixed to the adhesive ad. As a result, the ceramic sub-core 3 is supported from the second major surface MP2 side. The ceramic sub-core 3 can be accommodated accurately by using a mounting apparatus.

Figure 5:
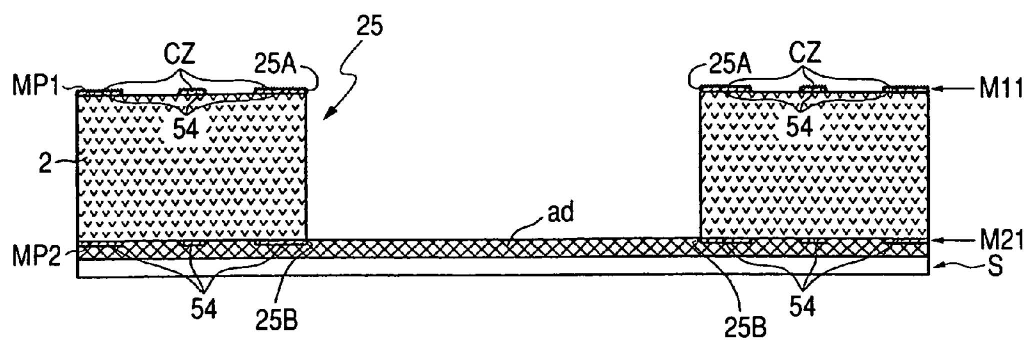
FIG. 5 shows manufacturing steps following the manufacturing steps of FIG. 4.
Figure 5:
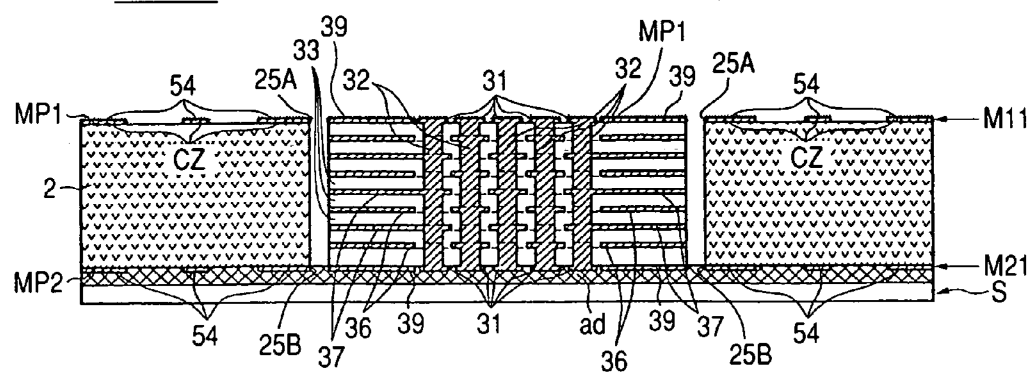
Figure 6:
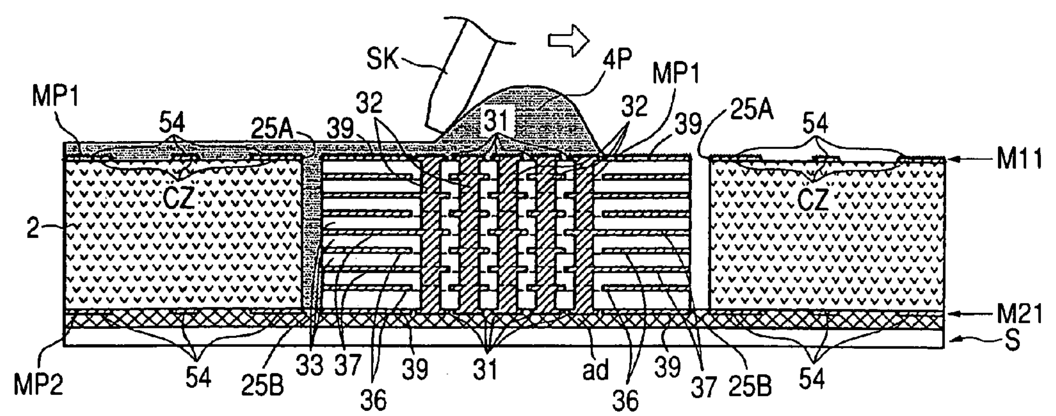
FIG. 6 shows a manufacturing step following the manufacturing steps of FIG. 5.
Figure 6:
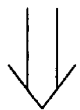
Figure 6:
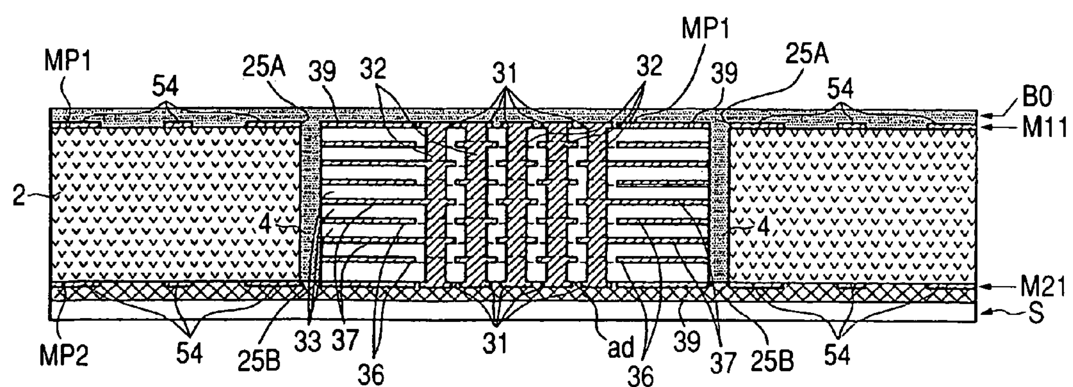

The ceramic sub-core 3 that is accommodated at this step is such that only the metallization pads 31 and the conductor pattern 39 provided on its first major surface MP1 have been subjected to Cu roughening treatment in advance. As shown in FIG. 5, the adhesive ad of the adhesion sheet S is adhered to the conductor patterns 54 provided on the second major surface MP2 of the core body 2 and the metallization pads 31 and the conductor pattern 39 provided on the second major surface MP2 of the ceramic sub-core 3. However, since these pads and patterns have not been subjected to Cu roughening treatment, there does not occur an even that the adhesive ad is buried in the asperities of roughened surfaces.

Figure 11:
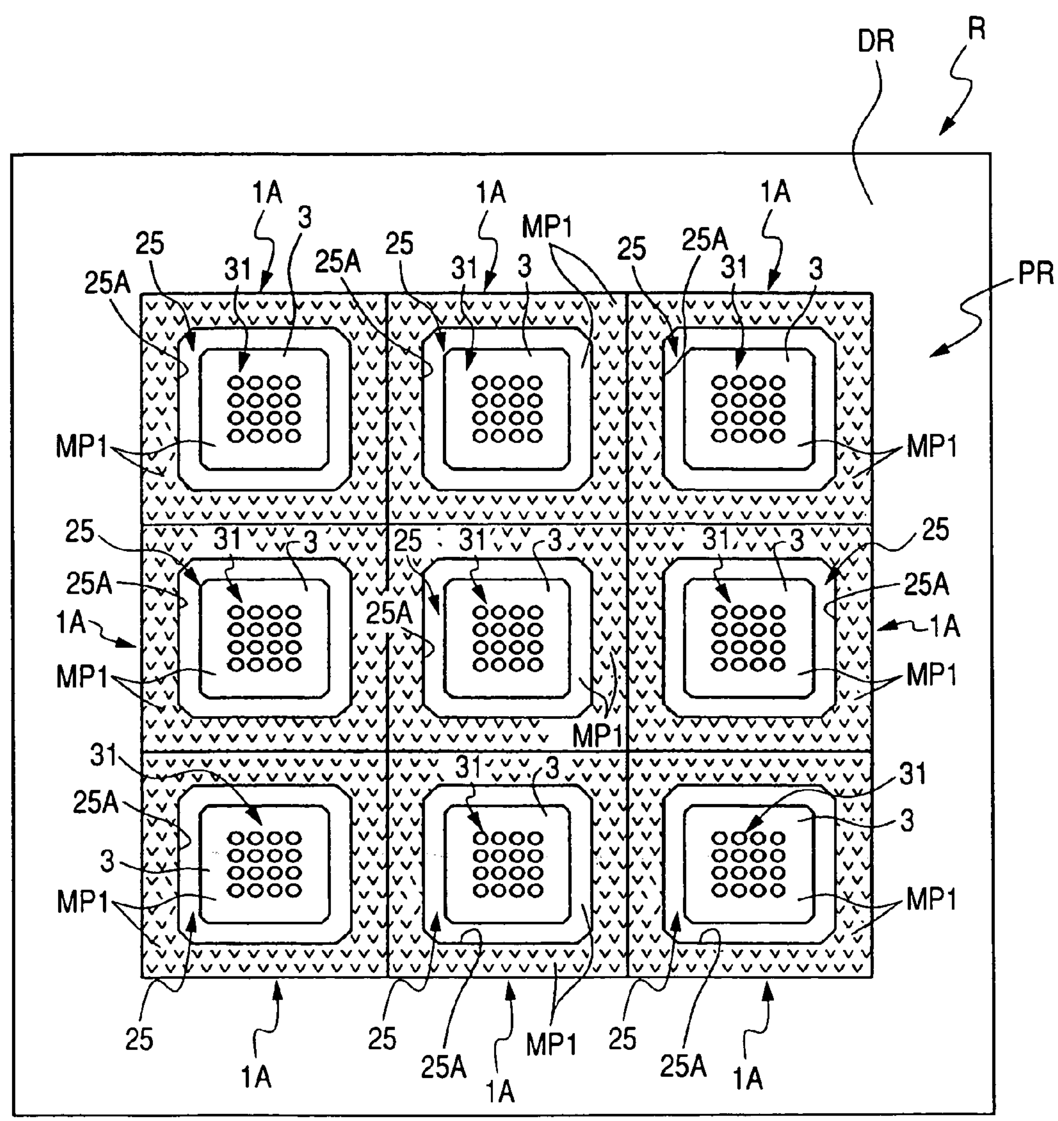
FIG. 11 is a top view of a board in a state that step 5 (sub-core accommodation step) has just completed.

As shown in FIG. 11 (top view), the manufacturing process of the wiring board 1A is executed on a multi-product manufacturing board R that consists of a product region PR in which plural product portions to become wiring boards 1A are arranged and a margin region DR around the product region PR. FIG. 11 shows a state after completion of step 5, that is, a state that the ceramic sub-core 3 has just been accommodated in the sub-core accommodation space 25. A gap is formed between the core body 2 and the ceramic sub-core 3. In the next step, the gap will be filled with a resin material in forming a lowest resin insulating layer B0 and a groove-filling portion 4 will thereby be formed. The sub-core accommodation space 25 and the ceramic sub-core 3 have square shapes. To prevent an event that cracks will develop in a groove-filling portion 4 when it is formed in the gap, the walls of the sub-core accommodation space 25 are formed with fillets along the wall-connecting lines and the corresponding edges of the ceramic sub-core 3 are chamfered.

At step 6 (printing step), a resin paste 4P is charged into the gap between the ceramic sub-core 3 and the core body 2 (a charged resin portion is formed) by pressure-printing the resin paste 4P from the side of the first major surfaces MP1 of the ceramic sub-core 3 and the core body 2 using a rubber squeegee SK. The pressure printing using the rubber squeegee SK allows the resin paste 4P to be charged into the gap between the ceramic sub-core 3 and the core body 2 without formation of voids. In this pressure printing, the resin paste 4P is directly printed on the first major surfaces MP1 of the ceramic sub-core 3 and the core body 2 without intervention of any mask. Therefore, at the same time as the gap between the ceramic sub-core 3 and the core body 2 is filled with the resin paste 4P, the first major surfaces MP1 of the ceramic sub-core 3 and the core body 2 are entirely covered with a layer that is continuous and integral with the charged resin portion (i.e., a layer to become a lowest resin insulating layer B0 is formed). The thus-formed charged portion and covering layer of the resin paste 4P are set (cured) by heating and drying them, whereby a groove-filling portion 4 and a lowest resin insulating layer B0 are formed.

Referring to FIG. 11, at step 6, a resin paste 4P is deposited on a portion, located on one side of the ceramic sub-core 3, of the margin region DR and is moved by the squeegee SK (see FIG. 6) toward another portion, located on the other side of the ceramic sub-core 3, of the margin region DR, whereby the resin paste 4P is charged into the gap between the ceramic sub-core 3 and the core body 2 and a layer entirely covering the first major surfaces MP1 of the ceramic sub-core 3 and the core body 2 is formed.

For example, the viscosity of the resin paste 4P is set at about 6 (preferably 30) to 57 Pa·s in a temperature range of room temperature (e.g., 25° C.) to 120° C. To obtain such viscosity, the filler content of the resin paste 4P may be set at 53 (preferably 70) to 80 wt %. The resin paste 4P may be a resin produced by adding acid anhydride to an epoxy resin or such a resin as amine.

The adhesion to later-formed resin insulating layers B11 and B21 can be increased by performing roughening treatment using potassium permanganate or the like after the groove-filling portion 4 and the lowest resin insulating layer B0 have been formed by setting (curing) the resin paste 4P by heating and drying it.

At step 7 and the following steps, wiring laminates L1 and L2 are formed by laminating conductor layers M12-M14 and resin insulating layers B11-B14 alternately on the first major surface MP1 (more specifically, the lowest resin insulating layer B0) of the core board CB in which the ceramic sub-core 3 is accommodated and laminating conductor layers M22-M24 and resin insulating layers B21-B24 alternately on the second major surface MP2 of the core board CB. This can be done by a known build-up process (a combination of a semi-additive method, a photolithography technique, etc.).

At step 7, resin insulating layers B11 and B21 are laminated on the first major surface MP1 (more specifically, the lowest resin insulating layer B0) and the second major surface MP2, respectively, of the core board CB in which the ceramic sub-core 3 is accommodated.

At step 8, on the first major surface MP1 side, multi-layer penetration via holes 65*a* are formed so as to penetrate through the lowest resin insulating layer B0 and the adjacent resin insulating layer B11 by such a technique as a laser via process or a photo via process. On the second major surface MP2 side, via holes 6*a* are formed in the resin insulating layer B21. As a result, the conductor pads 31 are partially exposed at the bottoms of the via holes 6*a* and the multi-layer penetration via holes 65*a*. After the formation of the via holes 6*a* and the multi-layer penetration via holes 65*a*, the surfaces of the conductor pads 31 are cleaned by de-smear treatment (i.e., treatment for removing resin residues) using potassium permanganate or the like.

At step 9, through-holes TH are formed with a drill or the like so as to penetrate, in the thickness direction, through the core board CB and the conductor layers M11 and M21 and the resin insulating layers B0, B11, and B21 which are formed on the major surfaces MP1 and MP2 of the core board CB. At step 10, Cu plating is performed (Cu electroplating is performed after electroless Cu plating) on the entire surfaces, whereby via conductors 6 and multi-layer penetration via conductors 65 are formed in the via holes 6*a* and the multi-layer penetration via holes 65*a*, respectively, and through-hole conductors 21 are formed on the inner surfaces of the through-holes TH.

At step 11, a resin hole-filling material 23 is charged into the spaces surrounded by the through-hole conductors 21 and Cu plating is then performed on the entire surfaces to form lid conductors 52. At step 12, the plated Cu layers covering the resin insulating layers B11 and B21 are etched into patterns of interconnections 51 etc. A core portion CR is thus obtained. Then, resin insulating layers B12-B14 and conductor layers M13 and M14 are laminated alternately and resin insulating layers B22-B24 and conductor layers M23 and M24 are laminated alternately in the same manner as described above. Holes are formed in the resin insulating layers B14 and B24 by such a technique as a laser via process or a photo via process, whereby pads 55 and 56 are exposed partially. Ni—Au plating is performed on the surfaces of the pads 55 and 56, and solder bumps 7 are formed on the pads 55. Subsequently, prescribed tests such as an electrical test and an appearance test are performed, whereby the wiring board 1A of FIG. 1 is completed.

Second Embodiment

Figure 12:
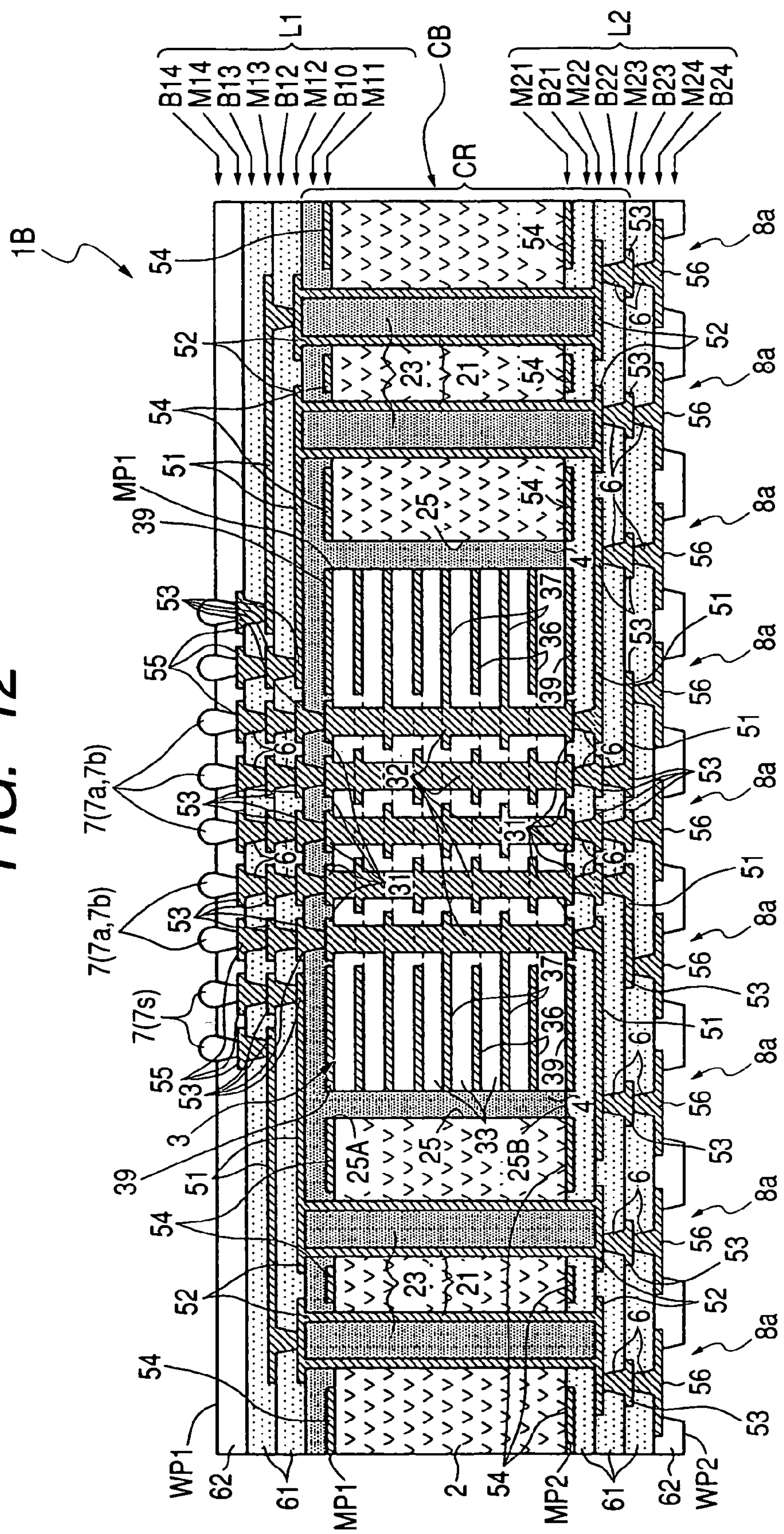
FIG. 12 is a schematic sectional view showing the configuration of a wiring board according to a second embodiment of the present invention.

A wiring board according to a second embodiment of the invention will be described with reference to the drawings. FIG. 12 is a schematic sectional view showing the configuration of a wiring board 1B according to the second embodiment. The following description will mainly be directed to points that are different than in the wiring board 1A according to the first embodiment, and components having the same or corresponding components in the first embodiment will be given the same reference symbols as the latter and will not be described.

The wiring board 1B according to the second embodiment does not have the adjacent resin insulating layer B11 of the wiring board 1A according to the first embodiment. That is, in the first-major-surface-MP1-side wiring laminate L1, via conductors 6 penetrate through only a lowest resin insulating layer B10 and connect the conductor pads 31 (conductive layer M11) formed on the first major surface MP1 of the ceramic sub-core 3 to the conductive layer M12 formed on the lowest resin insulating layer B10.

Figure 7:
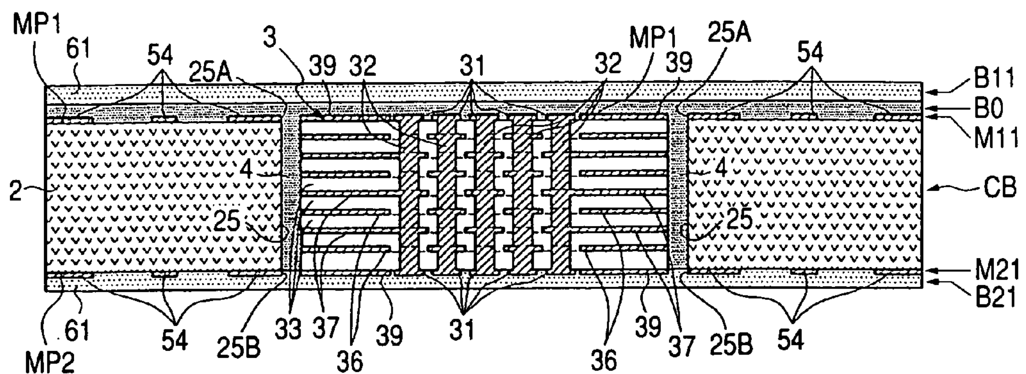
FIG. 7 shows manufacturing steps following the manufacturing step of FIG. 6.
Figure 7:
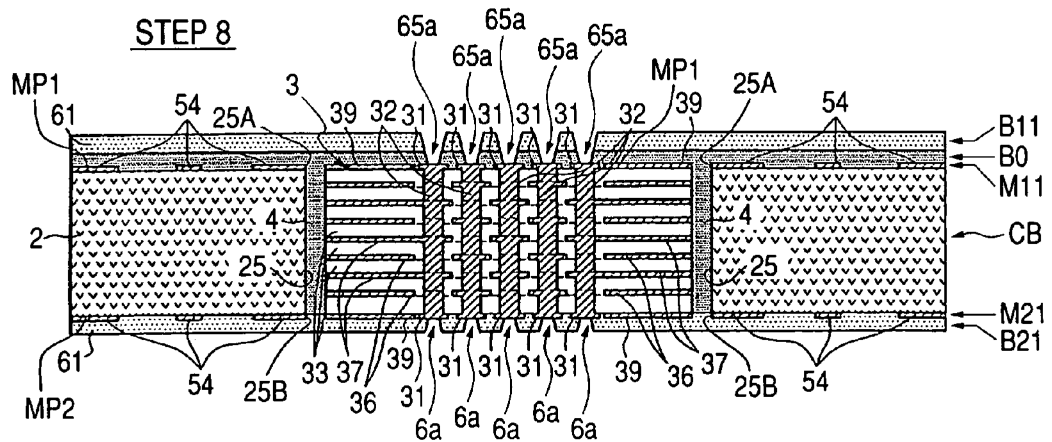
Figure 7:
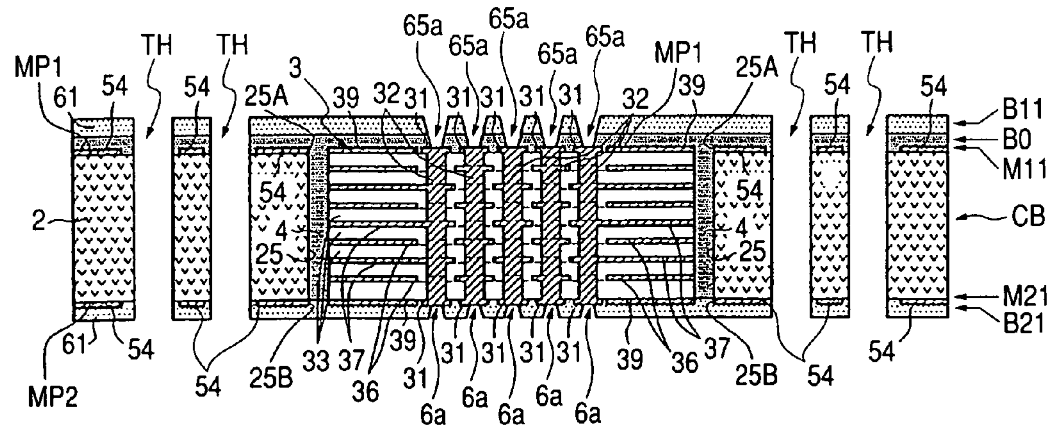
Figure 8:
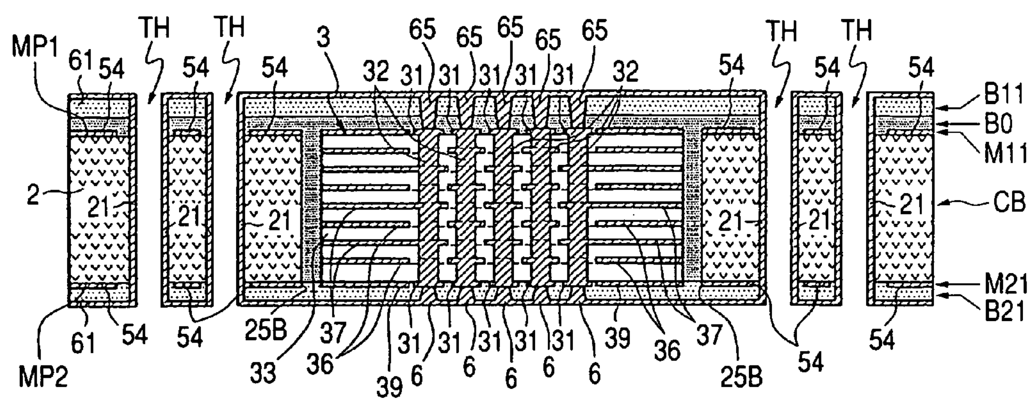
FIG. 8 shows manufacturing steps following the manufacturing steps of FIG. 7.
Figure 8:
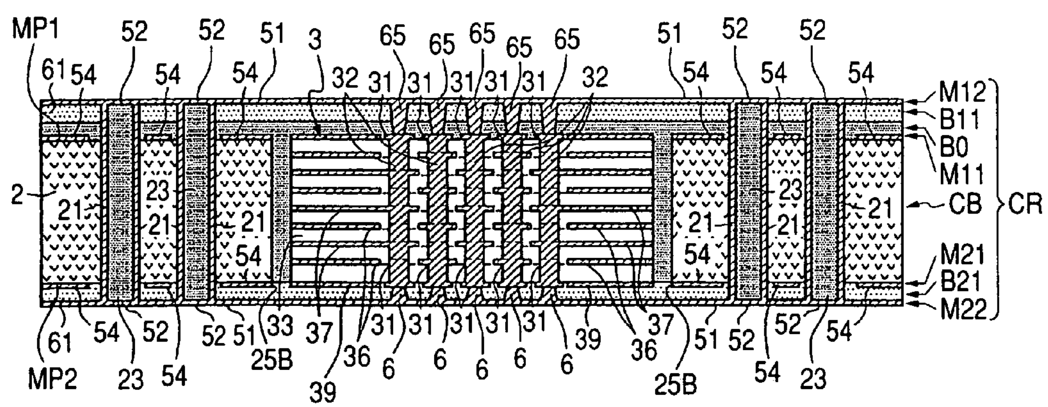
Figure 8:
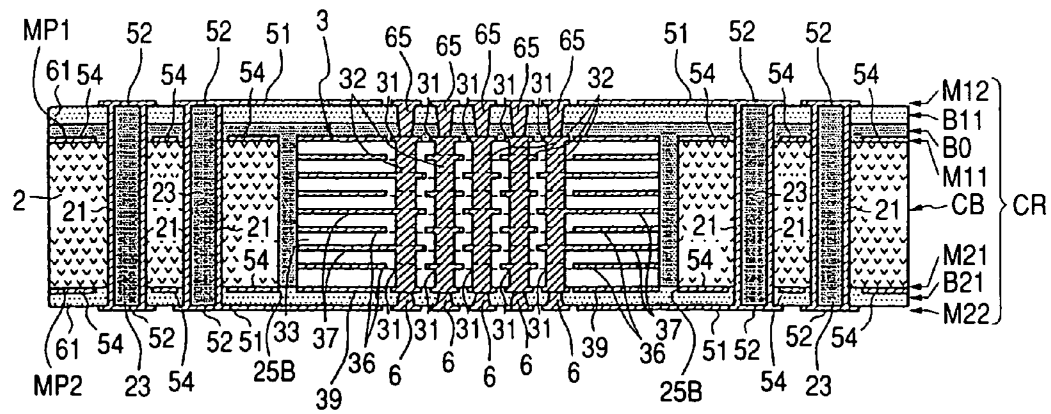

To manufacture the wiring board 1B, only a resin insulating layer B21 is laminated on the second major surface MP2 of the core board CB at step 7 (see FIG. 7).

Furthermore, to manufacture the wiring board 1B, step 6 and the following steps described above are changed to steps 6'-14' which will be described below.

Figure 15:
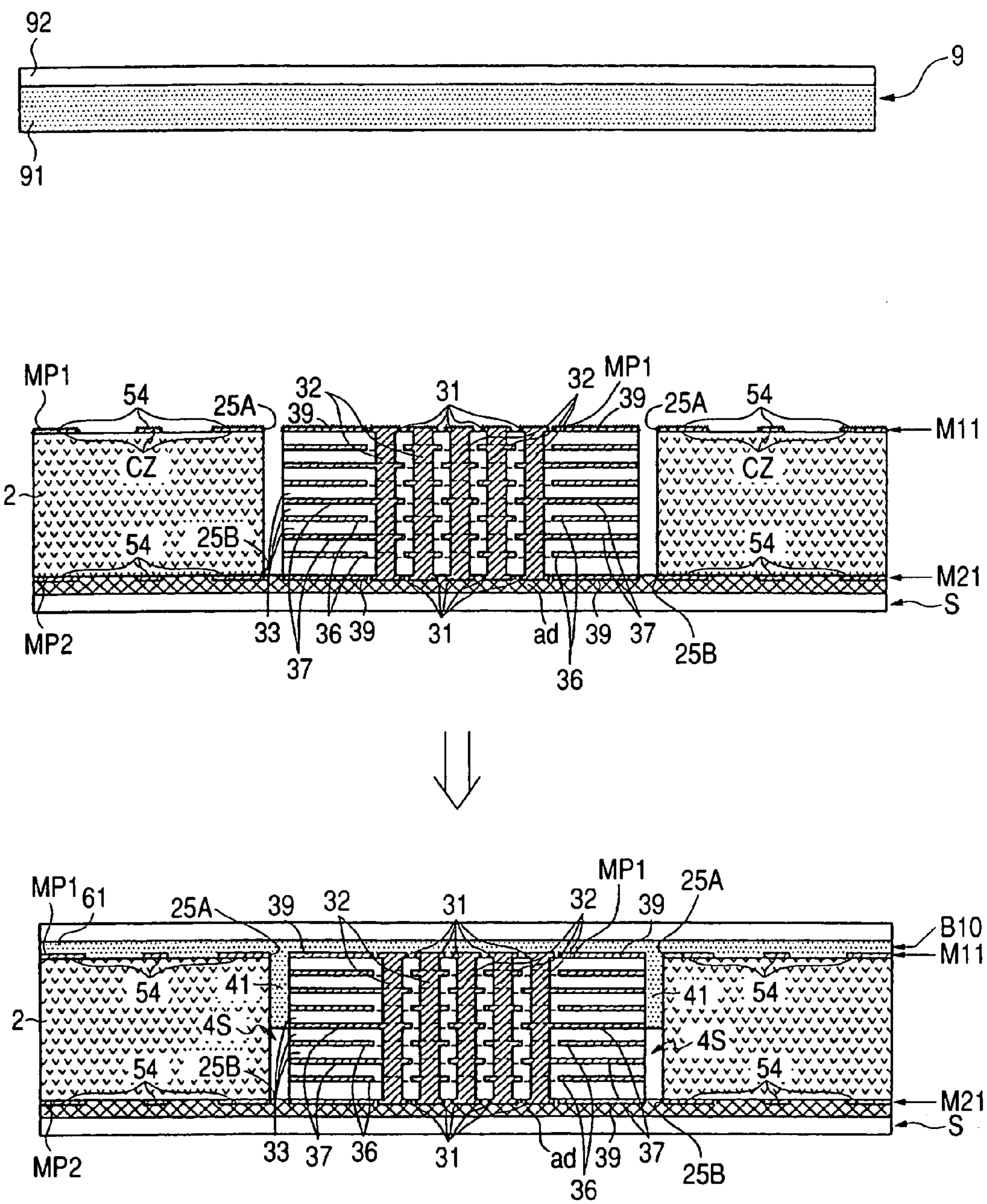
FIG. 15 shows a manufacturing step of another manufacturing process of a wiring board.

Steps 6'-8' are film formation and charging steps. First, at step 6', as shown in FIG. 15, a resin film 91 is compression-bonded to the core body 2 and the ceramic sub-core 3 from the first major surface MP1 side in a state that the ceramic sub-core 3 is supported by the adhesive sheet S from the second major surface MP2 side in the sub-core accommodation space 25. As a result, a lowest resin insulating layer B10 of a first-major-surface-MP1-side wiring laminate L1 is formed and a first groove-filling portion 41 is formed that fills a first-major-surface-MP1-side portion of the gap between the core body 2 and the ceramic sub-core 3 and is continuous with the lowest resin insulating layer B10.

The resin film 91, which is part of a resin film 9 having a mold release sheet 92, is compression-bonded to the first major surfaces MP1 of the core body 2 and the ceramic sub-core 3 in a low-pressure atmosphere by a laminating machine which operates according to a vacuum lamination method. The compression bonding is performed by a heating/pressing roll of the laminating machine. As a result, part of the resin film 91 is charged into a first-major-surface-MP1-side portion (e.g., approximately a half portion) of the gap between the core body 2 and the ceramic sub-core 3 and becomes a first groove-filling portion 41. The residual, second-major-surface-MP2-side portion 4S in which the first groove-filling portion 41 is not formed will be filled at a later step. According to this method, the first groove-filling portion 41 being charged is stopped halfway in the gap and hence does not go into the second major surface MP2 side.

The resin film 91 of the resin film 9 having the mold release sheet 92 is about 100 μm in thickness and is thicker than resin films to be used in laminating the other resin insulating layers B12, B13, B22, and B23 because it is necessary to form the first groove-filling portion 41. More specifically, the resin film 91 is about 1.5 to 2 times thicker than the resin insulating film B10 that has not been set yet, about 3 to 4 times thicker than the resin insulating film B10 in final form, and about 10% to 20% thicker than the ceramic sub-core 3.

Figure 16:
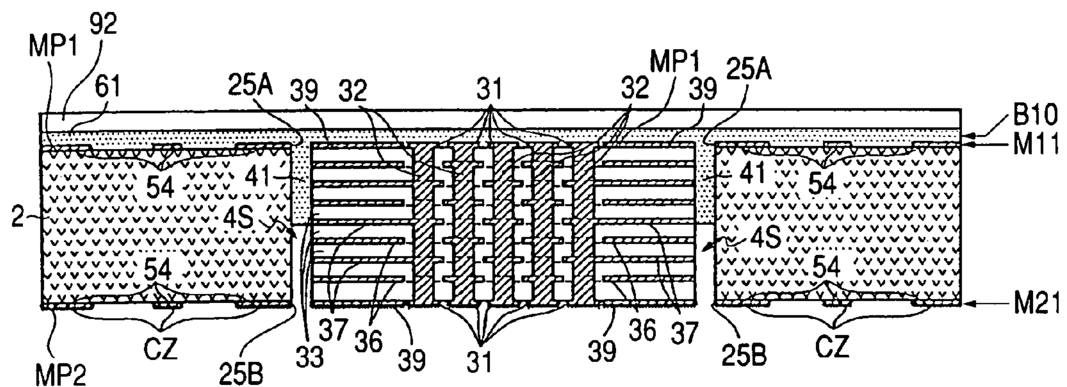
FIG. 16 shows a manufacturing step following the manufacturing step of FIG. 15.

At step 7', as shown in FIG. 16, the adhesive sheet S that is adhered to the second major surfaces MP2 of the core body 2 and the ceramic sub-core 3 is peeled off. After the adhesive sheet S has been peeled off, residues of the adhesive ad are removed with an organic solvent such as an alcoholic solvent (IPA). Then, to increase the adhesion to a later-formed resin insulating layer B21, Cu roughening treatment is performed on the conductor patterns 54 formed on the second major surface MP2 of the core body 2 and the conductor patterns (metallization pads 31 and dam metallization layer 39) formed on the second major surface MP2 of the ceramic sub-core 3.

Figure 17:
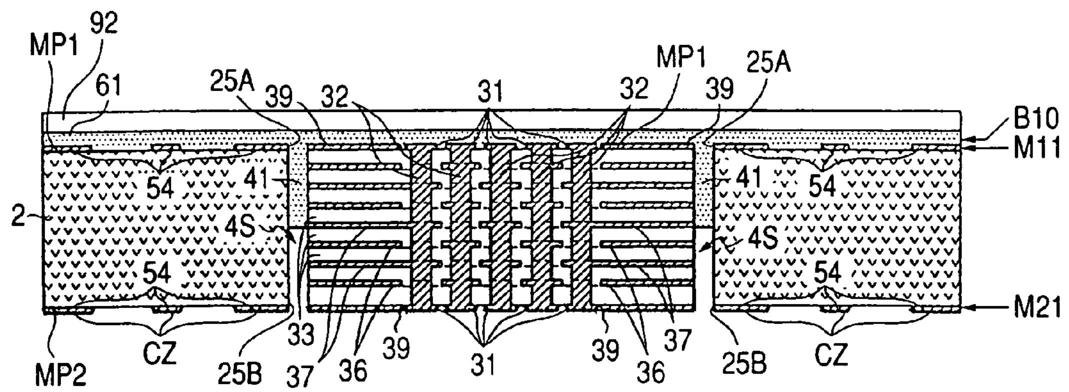
FIG. 17 shows a manufacturing step following the manufacturing step of FIG. 16.
Figure 17:
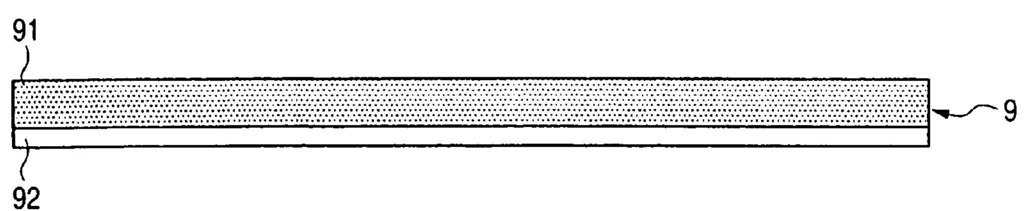
Figure 17:
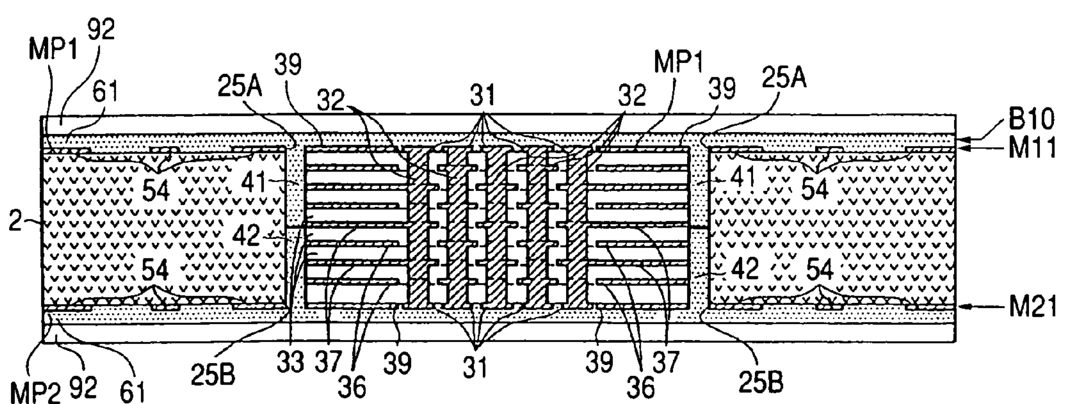

At step 8', as shown in FIG. 17, a resin film 91 is compression-bonded to the core body 2 and the ceramic sub-core 3 from the second major surface MP1 side in a state that the ceramic sub-core 3 is supported by the resin insulating layer B10 and the first groove-filling portion 41 from the first major surface MP1 side. As a result, a lowest resin insulating layer B21 of a second-major-surface-MP2-side wiring laminate L2 is formed and a second groove-filling portion 42 is formed that is continuous with the lowest resin insulating layer B21 and fills the residual portion 4S (i.e., the portion not filled with the first groove-filling portion 41) of the gap between the core body 2 and the ceramic sub-core 3.

Figure 18:
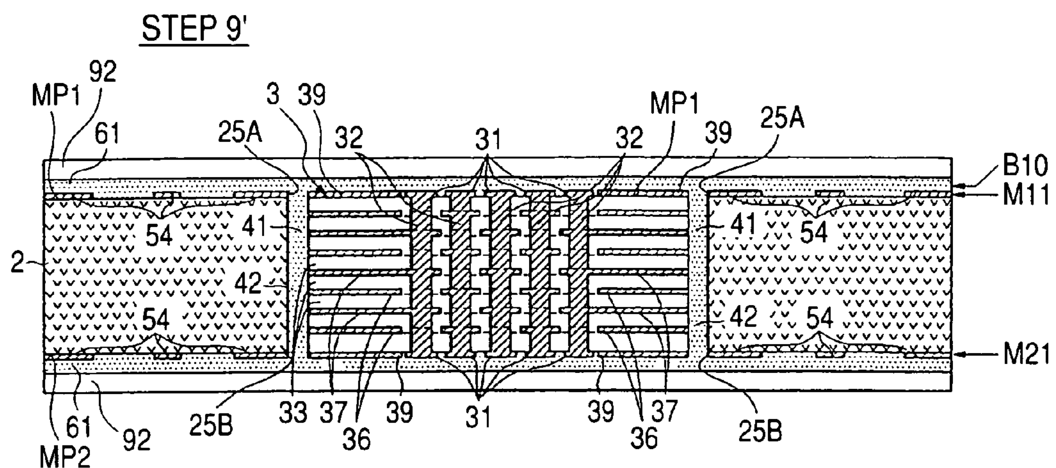
FIG. 18 shows manufacturing steps following the manufacturing step of FIG. 17.
Figure 18:
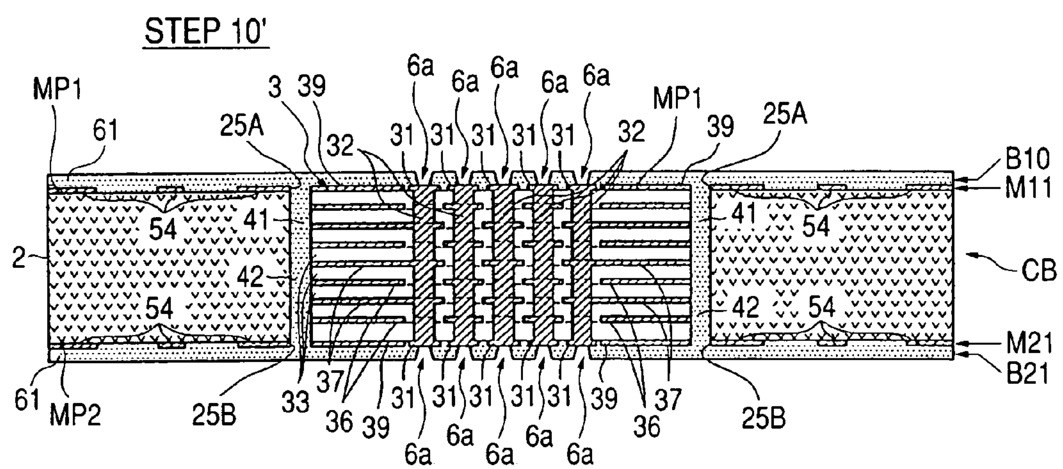
Figure 18:
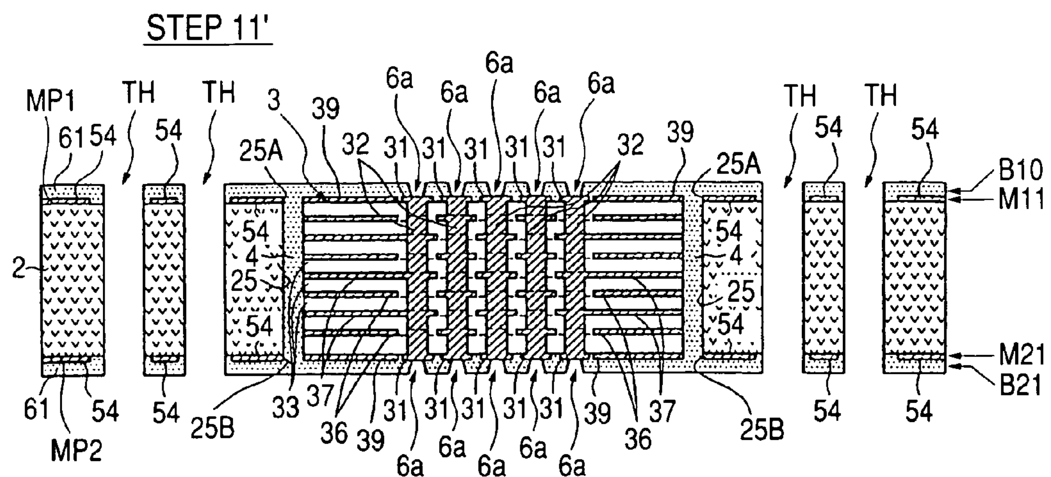
Figure 19:
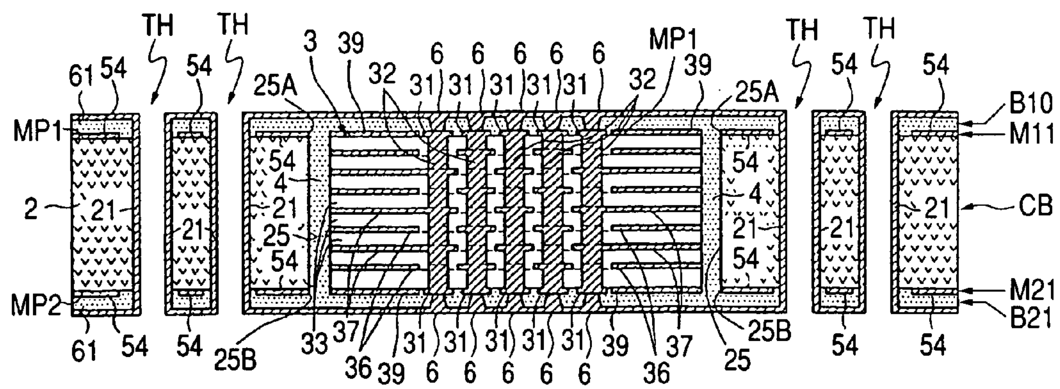
FIG. 19 shows manufacturing steps following the manufacturing steps of FIG. 18.
Figure 19:
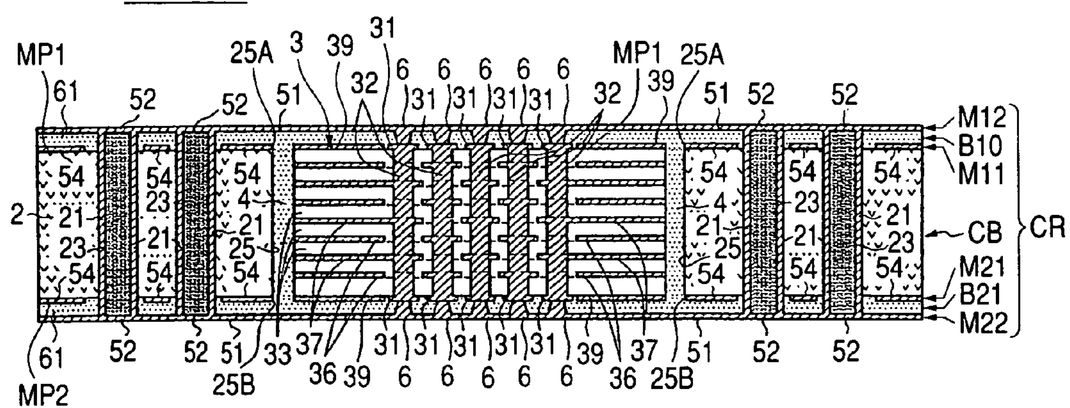
Figure 19:
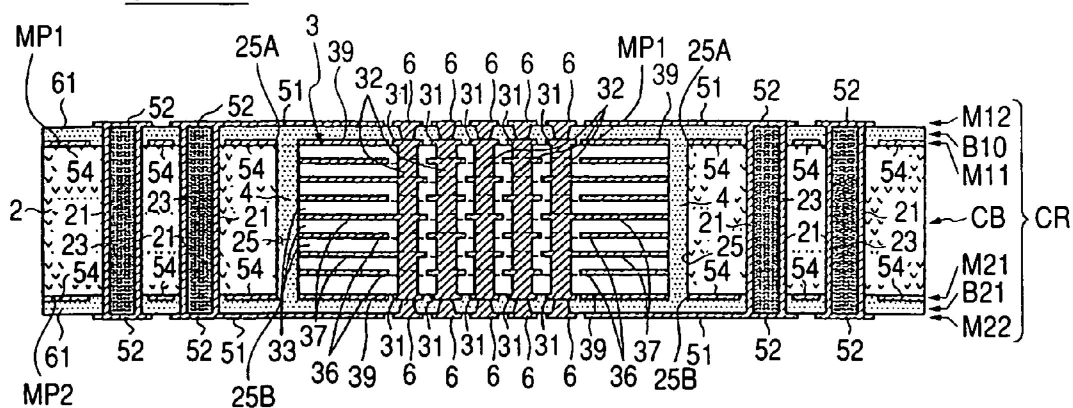

The second-major-surface-MP2-side resin film 91 is compression-bonded in the same manner as the first-major-surface-MP1-side resin film 91 was done. That is, the resin film 91, which is part of a resin film 9 having a mold release sheet 92, is compression-bonded in a low-pressure atmosphere by a laminating machine that operates according to the vacuum lamination method. The resin film 91 is compression-bonded in a state that the first-major-surface-MP1-side resin insulating layer B10 and the first groove-filling portion 41 are not fully cured (are half set). With this measure, at step 9', as shown in FIG. 18, when set completely, the first groove-filling portion 41 and the second groove-filling portion 42 are integrated with each other into a groove-filling portion 4 which fills the gap between the core body 2 and the ceramic sub-core 3 completely. The top part of FIG. 18 corresponding to step 9' shows a state before the mold release sheets 92 are removed from the resin films 91.

At step 10' and the following steps, wiring laminates L1 and L2 are formed by laminating conductor layers M12-M14 and resin insulating layers B12-B14 alternately on the resin insulating layer B10 and laminating conductor layers M22-M24 and resin insulating layers B22-B24 alternately on the resin insulating layer B21. This can be done by a known build-up process (a combination of a semi-additive method, a photolithography technique, etc.).

At step 10', via holes 6*a* are formed in the lowest resin insulating layers B10 and B21 by such a technique as a laser via process or a photo via process. As a result, the metallization pads 31 are partially exposed at the bottoms of the via holes 6*a*. After the formation of the via holes 6*a*, the surfaces of the metallization pads 31 are cleaned by de-smear treatment (i.e., treatment for removing resin residues) using potassium permanganate or the like. The formation of the via holes 6*a* and the de-smear treatment can be performed satisfactorily because only the one layer (i.e., the resin insulating layer B10 or B21) is formed on the metallization pads 31, that is, plural resin insulating layers having different characteristics are not formed on the metallization pads 31.

At step 11', through-holes TH are formed with a drill or the like so as to penetrate, in the thickness direction, through the core board CB and the conductor layers M11 and M21 and the resin insulating layers B10 and B21 which are formed on the major surfaces MP1 and MP2 of the core board CB. At step 12', Cu plating is performed (Cu electroplating is performed after electroless Cu plating) on the entire surfaces, whereby via conductors 6 are formed in the via holes 6*a* and through-hole conductors 21 are formed on the inner surfaces of the through-holes TH. At step 13', a resin hole-filling material 23 is charged into the spaces surrounded by the through-hole conductors 21 and Cu plating is then performed on the entire surfaces to form lid conductors 52. At step 14', the plated Cu layers covering the resin insulating layers B10 and B21 are etched into patterns of interconnections 51 etc.

A core portion CR is thus obtained. Then, resin insulating layers B12-B14 and conductor layers M13 and M14 are laminated alternately and resin insulating layers B22-B24 and conductor layers M23 and M24 are laminated alternately in the same manner as described above. Holes are formed in the resin insulating layers B14 and B24 by such a technique as a laser via process or a photo via process, whereby pads 55 and 56 are exposed partially. Ni—Au plating is performed on the surfaces of the pads 55 and 56, and solder bumps 7 are formed on the pads 55. Subsequently, prescribed tests such as an electrical test and an appearance test are performed, whereby the wiring board 1B of FIG. 12 is completed.

Figure 20:
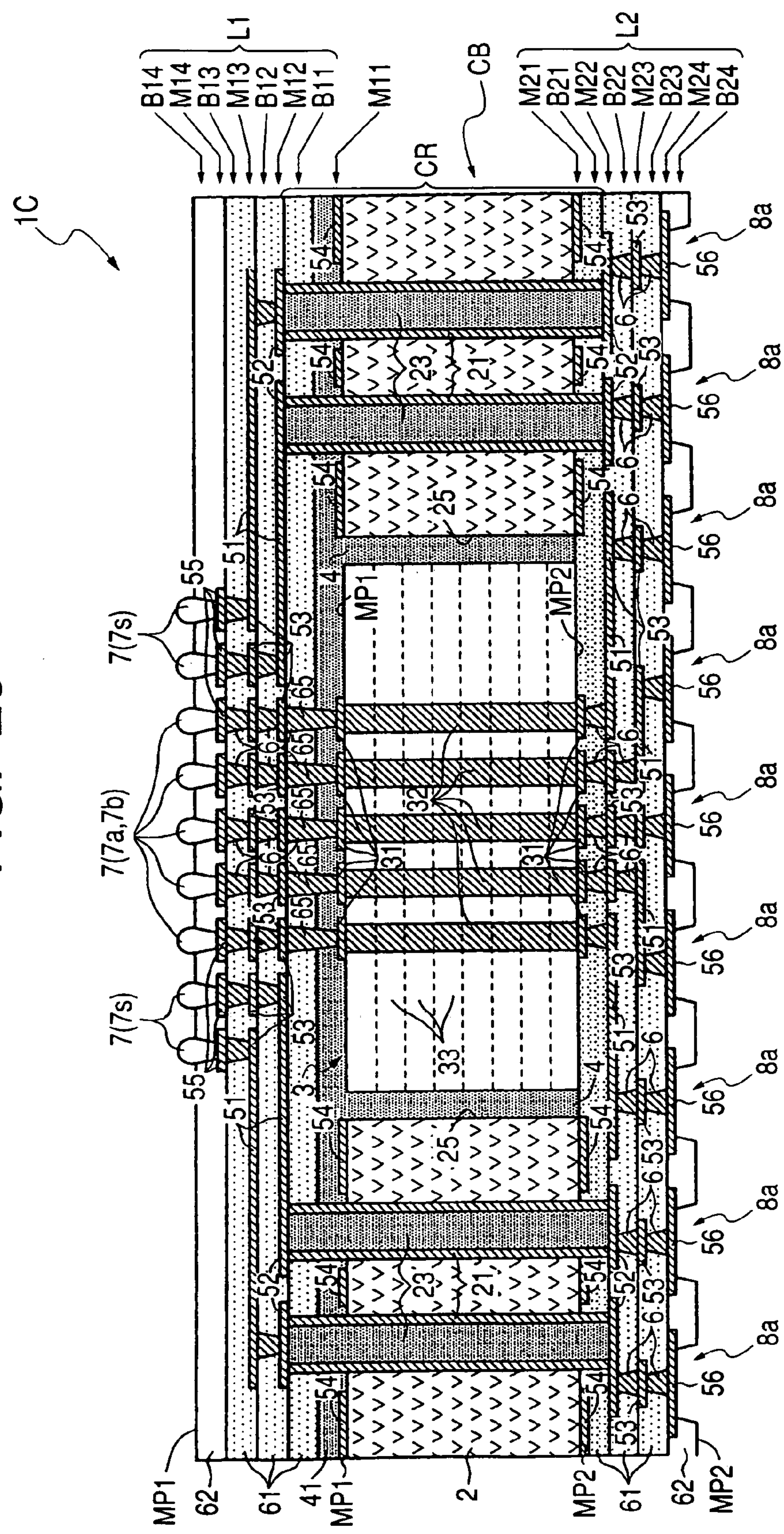
FIG. 20 shows a modification of the first embodiment in which no laminated ceramic capacitor is provided in the ceramic sub-core.

The above-described first embodiment (FIG. 1) and second embodiment (FIG. 12) are directed to the case that the entire ceramic sub-core 3 is a laminated ceramic capacitor, the invention is not limited to such a case. For example, the wiring board may be such that no laminated ceramic capacitor is provided in the ceramic sub-core 3 (see the wiring board 1C shown in FIG. 20) or that a laminated ceramic capacitor is provided so as to occupy only a first-major-surface-MP1-side portion of the ceramic sub-core 3 (see the wiring board 1D shown in FIG. 21). The ceramic sub-core 3 may be a ceramic capacitor in which thin films of a ceramic material is formed on a substrate (not limited to a ceramic substrate).

Figure 21:
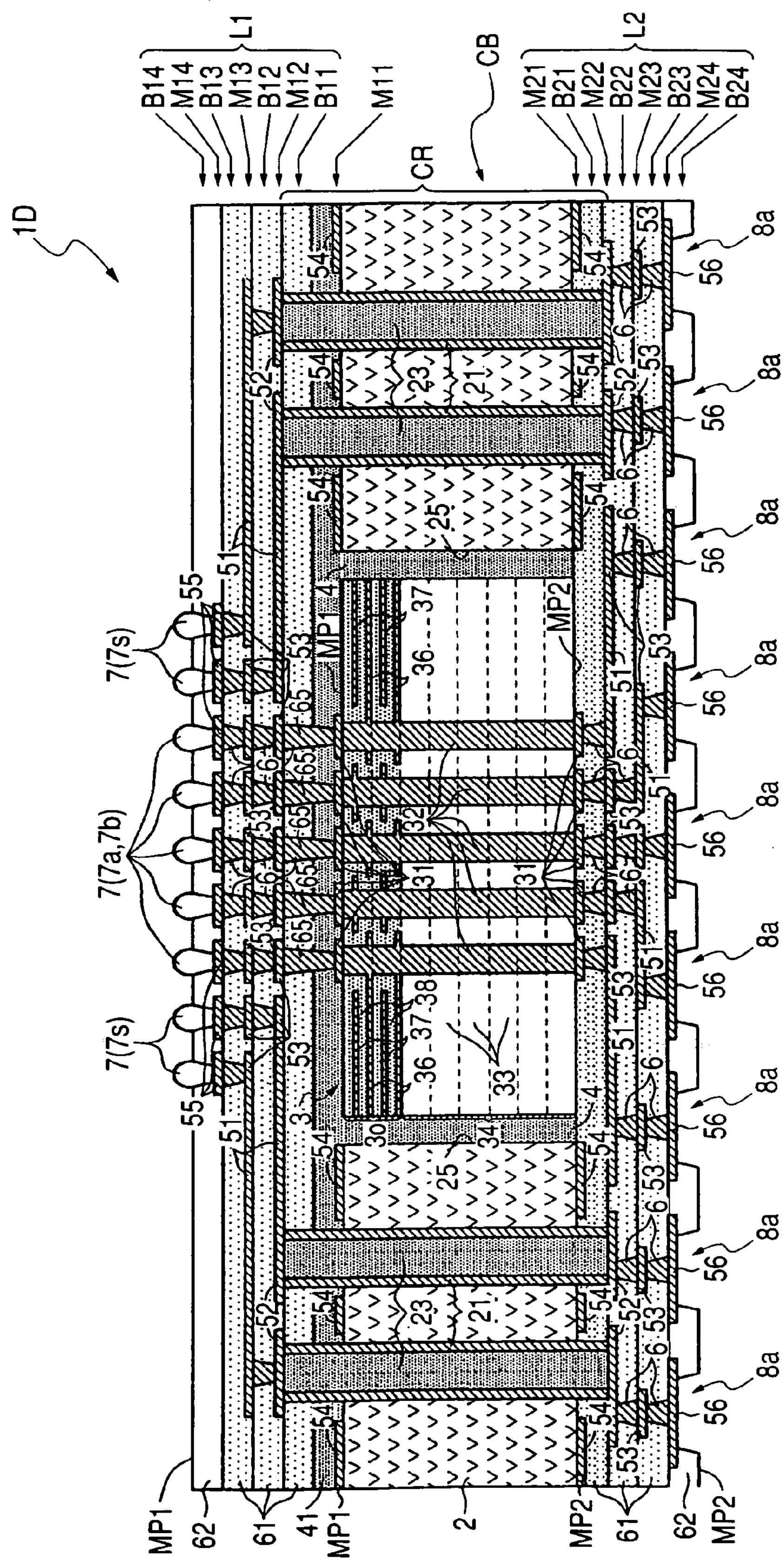
FIG. 21 shows a modification of the second embodiment in which a laminated ceramic capacitor is provided only on the side of a first major surface of the ceramic sub-core.
Figure 22:
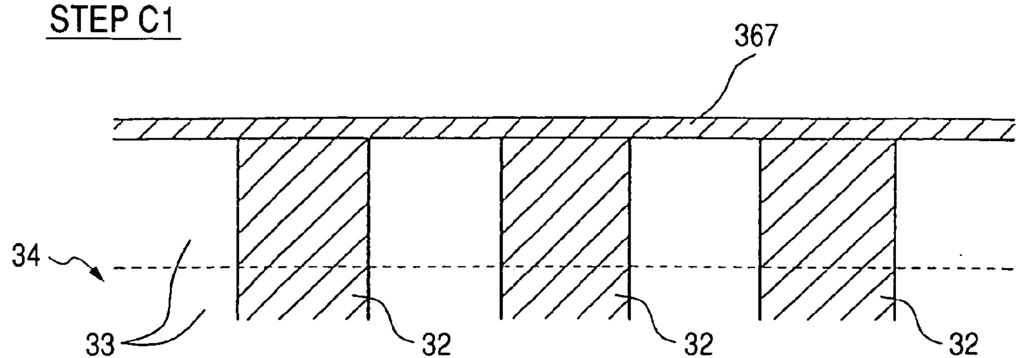
FIG. 22 shows manufacturing steps of a thin-film capacitor portion.
Figure 22:
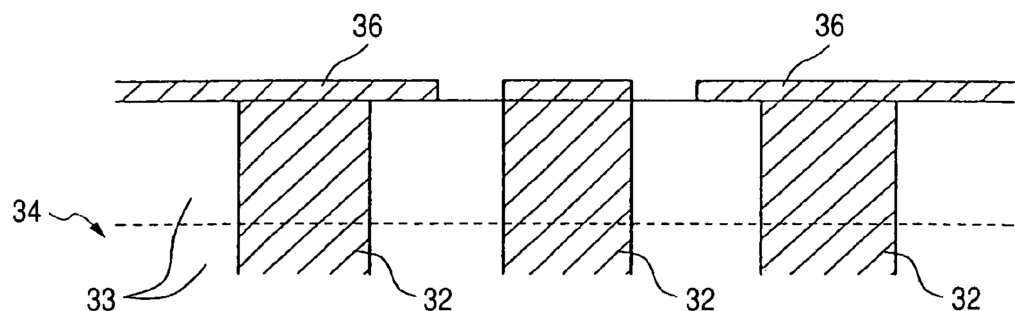
Figure 22:
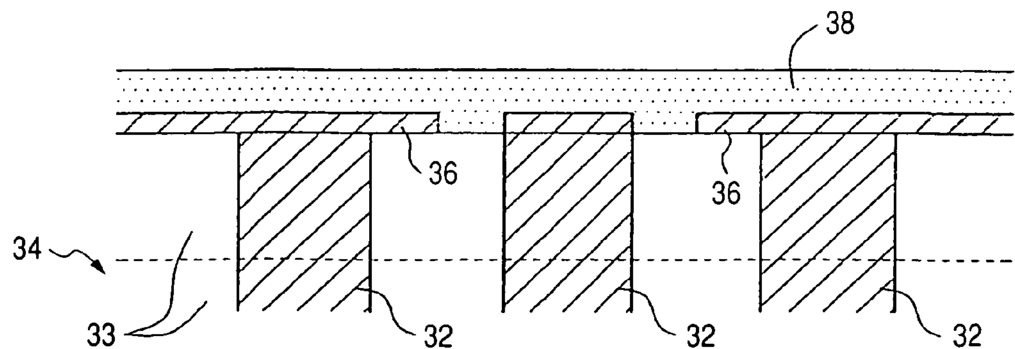
Figure 23:
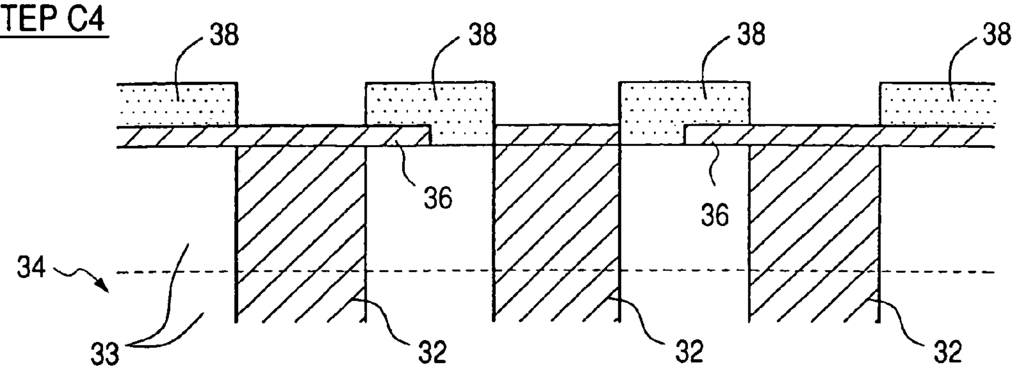
FIG. 23 shows manufacturing steps following the manufacturing steps of FIG. 22.
Figure 23:
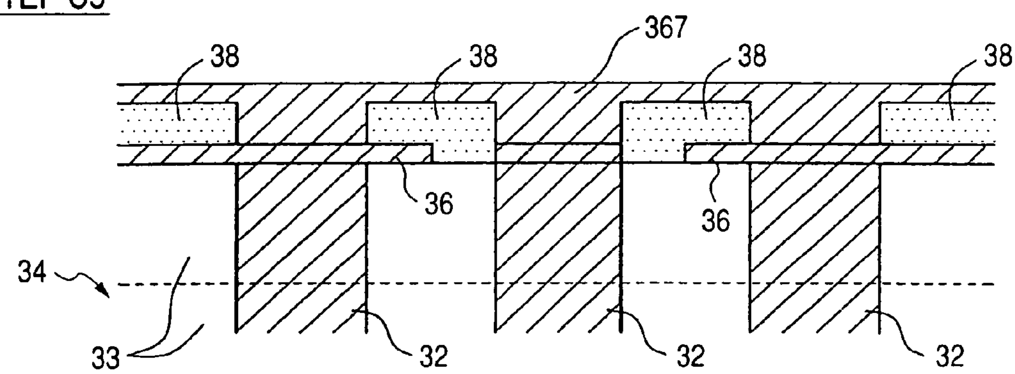
Figure 23:
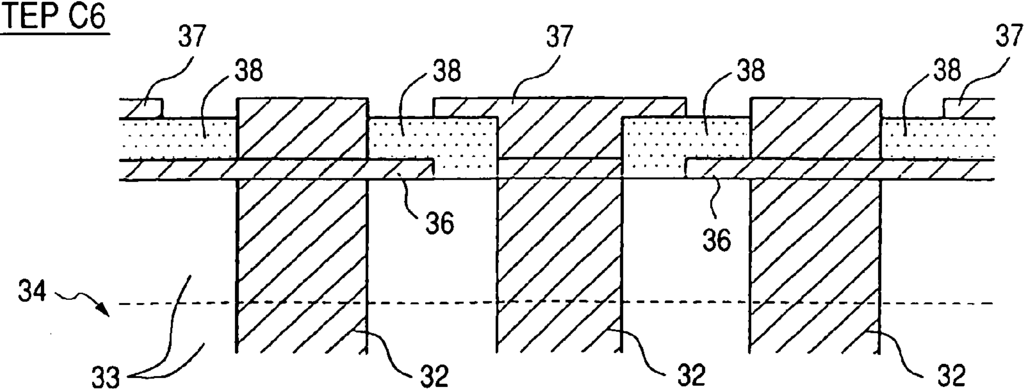

For example, a thin-film capacitor portion 3*c* shown in FIG. 21 can be manufactured by a process shown in FIGS. 22-24. The thin-film capacitor portion 3*c* is formed on a ceramic base 34. As described above, the ceramic base 34 is produced by laminating and firing known ceramic green sheets containing a ceramics material powder in which a metal power paste is charged in via holes formed by punching, laser hole formation, or the like.

Figure 24A:
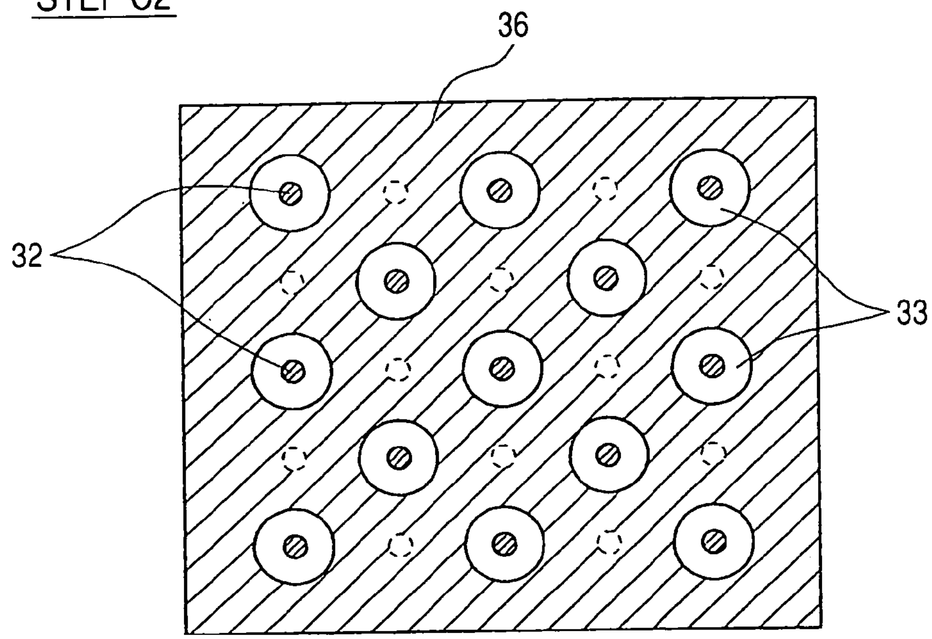
FIG. 24 (FIGS. 24A and 24B) is top views of in-process thin-film capacitor portions.
Figure 24B:
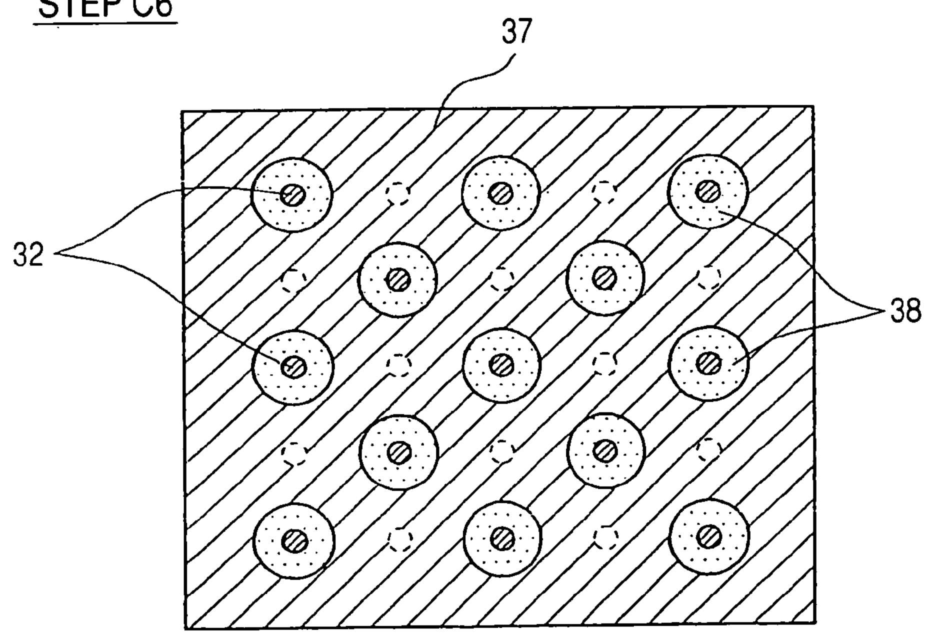

First, at step C1, a metal thin film 367 is formed on one major surface of the ceramic base 34. At step C2, those portions (each shaped like a doughnut) of the metal thin film 367 which surround the power or ground penetration conductors 32 are etched away, whereby the penetration conductors 32 are separated from an electrode conductor thin film 36. FIG. 24A is a top view of an in-process thin-film capacitor portion in this state. At step C3, a dielectric thin film 38 is formed by a sol-gel method, for example, so as to cover the entire electrode conductor thin film 36. At step C4, holes are formed in the dielectric thin film 38 at positions corresponding to the penetration conductors 32. At step C5, a metal thin film 367 is formed in the same manner as at step C1. At step C6, those portions (each shaped like a doughnut) of the metal thin film 367 which surround the penetration conductors 32 that are different from the ones mentioned in the above description of step C2 are etched away, whereby the penetration conductors 32 are separated from an electrode conductor thin film 37. FIG. 24B is a top view of an in-process thin-film capacitor portion in this state. A structure in which plural dielectric thin films 38 and plural electrode conductor thin films 36 or 37 are laminated alternately is produced by repeating the above steps.

The embodiments of the invention have been described above. However, the invention is not limited to these embodiments and can be practiced in appropriately modified forms within the range of equivalence.

This application is based on Japanese Patent application JP 2005-163673, filed Jun. 3, 2005, Japanese Patent application JP 2005-293806, filed Oct. 6, 2005, and Japanese Patent application JP 2006-87569, filed Mar. 28, 2006, the entire contents of which are hereby incorporated by reference, the same as if set forth at length.

What is claimed is:

1. A wiring board comprising: a core board including a core body and a ceramic sub-core which is accommodated in a sub-core accommodation space that is a through-hole that communicates with first and second major surfaces of the core body or a recess having an opening in a first major surface of the core body; and first and second wiring laminates each formed by resin insulating layers and conductor layers laminated on the first and second major surfaces of the core board, respectively, wherein:

said first wiring laminate includes a lowest resin insulating layer and an overlying resin insulating layer overlying said lowest resin insulating layer;

a groove-filling portion which fills a gap between the core body and the ceramic sub-core is integral with the lowest resin insulating layer of the first wiring laminate, the lowest resin layer is provided on the gap between the core body and the ceramic sub-core and on the ceramic sub-core, the lowest resin insulating layer is present between an upper surface of the ceramic sub-core and the overlying resin insulating layer of the first wiring laminate, and the lowest resin insulating layer is in contact with the upper surface of the ceramic sub-core; and via conductors that are connected to respective conductor patterns formed on a first major surface of the ceramic sub-core penetrate through the lowest resin insulating layer.

2. The wiring board according to claim 1, wherein an inclination of a surface, located over the gap between the core body and the ceramic sub-core, of the lowest resin insulating layer is smaller than an inclination of a surface connecting a top end of an inner side surface of the core body and a top end of an outer side surface of the ceramic sub-core, with respect to the first major surface of the core body.

3. The wiring board according to claim 2, wherein an inclination of the surface of the lowest resin insulating layer is smaller than an inclination of the surface connecting the top end of the inner side surface of the core body and the top end of the outer side surface of the ceramic sub-core, with respect to the first major surface of the core body.

4. The wiring board according to claim 1, wherein a surface, located over the gap between the core body and the ceramic sub-core and over the ceramic sub-core, of the lowest resin insulating layer is substantially parallel with the first major surface of the core body.

5. The wiring board according to claim 1, wherein, in the first wiring laminate, the via conductors which penetrate through the lowest resin insulating layer are part of respective multi-layer penetration via conductors that penetrate through plural layers including the lowest resin insulating layer and a resin insulating layer adjacent to the lowest resin insulating layer, and which multi-layer penetration via conductors connect the conductor patterns formed on the first major surface of the ceramic sub-core to a conductor layer formed on the adjacent resin insulating layer.

6. The wiring board according to claim 1, wherein, in the first wiring laminate, the via conductors which penetrate through the lowest resin insulating layer connect the conductor patterns formed on the first major surface of the ceramic sub-core to a conductor layer formed on the lowest resin insulating layer.

7. The wiring board according to claim 2, wherein the lowest resin insulating layer is provided on the gap between the core body and the ceramic sub-core, on the ceramic sub-core, and also on the core body, and an inclination of the surface of the lowest resin insulating layer is smaller than an inclination of the surface connecting the top end of the inner side surface of the core body and the top end of the outer side surface of the ceramic sub-core, with respect to the first major surface of the core body.

8. The wiring board according to claim 4, wherein the lowest resin insulating layer is provided on the gap between the core body and the ceramic sub-core, on the ceramic sub-core, and also on the core body, and an inclination of the upper surface of the lowest resin insulating layer is smaller than an inclination of a surface connecting a top end of an inner side surface of the core body and a top end of an outer side surface of the ceramic sub-core, with respect to the first major surface of the core body.

* * * * *